(12) United States Patent
Hoover

(10) Patent No.: US 7,449,946 B1
(45) Date of Patent: Nov. 11, 2008

(54) HIGH VOLTAGE, HIGH CURRENT, AND HIGH ACCURACY AMPLIFIER

(76) Inventor: D. Robert Hoover, P.O. Box 724, Bellingham, WA (US) 98248

( * ) Notice: Subject to any disclaimer, the term of this patent is extended or adjusted under 35 U.S.C. 154(b) by 0 days.

(21) Appl. No.: 12/111,056

(22) Filed: Apr. 28, 2008

Related U.S. Application Data

(62) Division of application No. 11/325,884, filed on Jan. 4, 2006, now Pat. No. 7,365,605.

(60) Provisional application No. 60/641,724, filed on Jan. 5, 2005.

(51) Int. Cl.
    *H03F 1/26* (2006.01)
(52) U.S. Cl. .................. 330/149; 375/297
(58) Field of Classification Search .......... 330/149; 375/297; 455/114.3
    See application file for complete search history.

(56) References Cited

U.S. PATENT DOCUMENTS

| | | | |
|---|---|---|---|
| 6,054,894 A * | 4/2000 | Wright et al. | 330/149 |
| 7,003,051 B2 * | 2/2006 | Francos et al. | 375/296 |
| 7,085,330 B1 * | 8/2006 | Shirali | 375/296 |
| 7,366,252 B2 * | 4/2008 | Cova et al. | 375/296 |

* cited by examiner

*Primary Examiner*—Henry K Choe
(74) *Attorney, Agent, or Firm*—Kevin Roe

(57) ABSTRACT

A method and system to use voltage isolated and floating differential output amplifiers wired in series and parallel to achieve arbitrary output drive voltage and current for the applications load. Embodiments use multiple voltage-isolated and linearized devices to enable dynamically modifiable, Class A, Class B, and Class AB topologies of predetermined voltage and current performance. Embodiments can correct an output by linearizing one or more devices in a circuit by utilizing a linearization module (e.g., including one or more digital lookup tables, an error simulation circuit, or an equivalent) to linearize at least one parameter of at least one device in the circuit.

20 Claims, 20 Drawing Sheets

HIGH VOLTAGE, HIGH CURRENT, AND HIGH ACCURACY AMPLIFIER

CROSS-REFERENCE TO RELATED APPLICATIONS

This application is a division of a co-pending U.S. utility patent application Ser. No. 11/325,884, filed Jan. 4, 2006, entitled "High Voltage, High Current, and High Accuracy Amplifier," to be issued as U.S. Pat. No. 7,365,605 on Apr. 29, 2008. This application also claims priority from a U.S. provisional patent application Ser. No. 60/641,724, filed Jan. 5, 2005, by the same inventor, entitled "High Voltage, High Current, High Accuracy Solid State Audio Amplifier With Adaptive Performance Enhancement," which is hereby incorporated by reference.

BACKGROUND OF THE INVENTION

1. Field of the Invention

This invention relates to amplifier circuits, and in particular, to providing a lower distortion amplifier capable of creating high voltages to drive highly capacitive loads.

2. Description of the Prior Art

With the development of high performance audio formats like SACD and DVD-Audio, new demands are being placed on audio reproduction equipment. Electrostatic speakers provide the highest performance achievable to date. Most electrostatic speakers use conventional low voltage power amplifiers and step-up transformers to produce the thousands of volts necessary to drive electrostatic transducers. These output transformers limit the signal fidelity of what is achievable with electrostatic speakers.

Such a design needs to handle the difficult capacitive loading, yet provide extremely low distortion. Traditional high negative feedback amplifier designs have a very difficult time producing highly damped, low distortion signals at high currents while maintaining feedback control, in many applications. Large amounts of negative feedback have traditionally been used to control the varying current needs for the capacitance loading. Capacitive loading also increases the power handling demands on the amplifier at high frequencies.

The high fidelity requirements of such applications mandate that the level of distortion at all frequencies be imperceptibly small. At higher frequencies the dynamics of the music must be maintained while driving high current capacitive loads. At lower frequencies the current requirements are thousands of times smaller because of the higher impedances. With these extremes occurring simultaneously, the reproduced dynamics are much higher than just what is provided by the input signal. As a result, the amplifier must have much lower distortion than traditional high performance amplifiers, while handling extremely high impulse and high frequency currents cleanly. Therefore, the dynamic range and feedback systems of amplifiers for such applications need to be many times better than those designed for a traditional amplifier driving an almost pure resistive load.

One common characteristic of many high negative feedback amplifiers is that the distortion effectively increases, as the signal level gets lower. This is counter to the needs of an amplifier with dynamic range requirements of high capacitive loading. This phenomenon is the result of several processes. One process is the continual "hunting" that is inherent in these designs. The constant correction of the feedback circuit induces extra output noise into the output signal. This "hunting" signature of the output noise hides many of the subtle details of the input signal (e.g., the music signal, or an equivalent amplifier input signal). In audio amplifier applications, this output noise can mask the low and mid frequency music detail quite easily.

The large time delays of the large output devices required for the high currents in traditional amplifiers, and the delays present in the multiple input stages of the amplifier, can also produce noticeable overshoot and input stage overload, especially at high currents and high frequencies. This performance is needed in low distortion amplification of audio recording signals, and also for other applications requiring low signal distortion by amplifiers.

In view of the foregoing, what is needed is an improved method and circuit to provide the lowest distortion achievable by any amplifier and create high voltages to drive electrostatic speakers or other loads, without the limitations of using large output transformers driving highly capacitive transducer loads.

SUMMARY OF THE INVENTION

The present invention can be implemented in numerous ways, such as by a method, a circuit, or an amplifier system. Four aspects of the invention are described below.

A first aspect of the invention is directed to a method to produce a bipolar output signal from a circuit having at least two stages. The method includes coupling an input signal to a first stage of a circuit to produce a first stage output, wherein the first stage of the circuit includes one or more modules coupled together to produce the first stage output; and applying the first stage output as an input signal to a second stage of the circuit to produce a bipolar second stage output, wherein the second stage of the circuit includes one or more floating modules coupled together to produce the bipolar second stage output.

A second aspect of the invention is directed to a method to produce a differential bipolar output signal from a circuit having at least two stages. The method includes coupling an input signal to a first stage of a circuit to produce a first stage output, wherein the first stage of the circuit includes one or more modules coupled together to produce the first stage output; and applying the first stage output as an input signal to a second stage of the circuit to produce a differential bipolar second stage output, wherein the second stage of the circuit includes one or more floating modules coupled together to produce the differential bipolar second stage output.

A third aspect of the invention is directed to a circuit to produce a bipolar output signal from a circuit having at least two stages. The apparatus includes a first stage of a circuit to produce a first stage output, when an input signal is coupled to the first stage output, wherein the first stage of the circuit includes one or more modules coupled together to produce the first stage output; and a second stage of the circuit to produce a bipolar second stage output, wherein the second stage of the circuit includes one or more floating modules coupled together to produce the bipolar second stage output.

A fourth aspect of the invention is directed to a circuit, having at least two stages, to produce a differential bipolar output signal. The circuit includes a first stage of a circuit to produce a first stage output from an input signal, wherein the first stage of the circuit includes one or more modules coupled together to produce the first stage output; and a second stage of the circuit to produce a differential bipolar second stage output after applying the first stage output to as an input signal, wherein the second stage of the circuit includes one or more floating modules coupled together to produce the differential bipolar second stage output.

These and other objects and advantages of the invention will become apparent to those skilled in the art from the following detailed description of the invention and the accompanying drawings.

DETAILED DESCRIPTION OF THE PREFERRED EMBODIMENT

The invention provides a method, an apparatus, and a system to obtain low distortion amplification of signals (e.g., audio-frequency signals, higher frequencies, or equivalent signals requiring low distortion amplification. Various embodiments of the invention can be applied to biological applications, medical applications, electronic applications, and any other applications where low distortion amplification can be beneficially used and needed for driving capacitive loads. In this specification, drawings, and claims, any instance of the term audio-frequency is defined as any signal frequency in the frequency range of 15 to 20,000 cycles per second (Hertz).

Other terms used below are defined as follows. Unipolar amplifier—An amplifier that has a single power supply, where the amplifier has a single output that is offset from the power supply rails. This output typically needs a blocking capacitor to provide an unbiased output with respect to a power supply reference. Bipolar amplifier—An amplifier that has the equivalent of two power supplies, one positive and one negative with respect to a reference point. This layout allows for a single output with no DC bias with respect to the power supply reference. Differential amplifier—An amplifier which has two outputs, one which goes positive with a positive output and one which goes the negative direction with a positive output. When this amplifier is floating, the two output amplifiers can be either unipolar or bipolar, since they do not require a power supply reference to provide output power.

In one embodiment of the invention, a bipolar amplifier can stand-alone and be combined with another inverting bipolar amplifier to produce a differential output amplifier. Therefore, the modular approach starts with a single bipolar amplifier and can be expanded to paralleled and/or serialized segmented differential amplifiers. This allows building floating bipolar amplifiers in various embodiments of the invention.

Solid-state amplifiers have not been used regularly for direct high voltage drive of electrostatic loudspeakers. The drive voltages necessary for electrostatic speakers are generally around 2000 $V_{RMS}$. Solid-state devices, such as transistors and MOSFETs, normally will withstand a maximum of 1000 $V_{DC}$. Various embodiments of the invention described here will economically produce almost arbitrarily large drive voltages. It is also applicable for lower voltage high performance amplifiers driving traditional loudspeakers.

Figure 1:
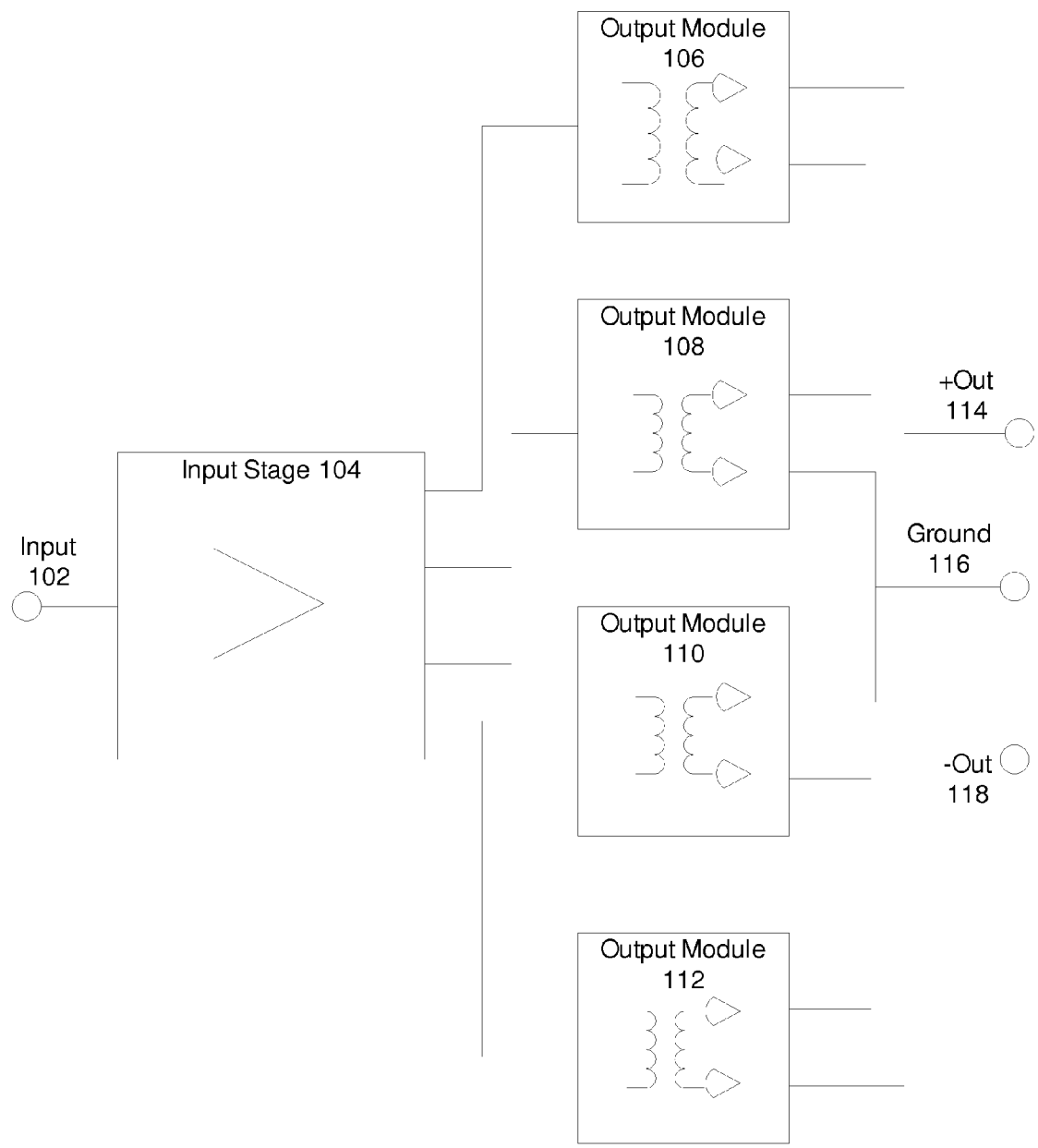
FIG. 1 illustrates the use of floating differential drive amplifier modules coupled in series for a segmented high voltage amplifier, in accordance with one embodiment of the invention.

FIG. 1 illustrates the use of floating differential drive amplifier modules coupled in series for a segmented high voltage amplifier, in accordance with one embodiment of the invention. Input signal 102 is input to input stage 104, which in turn provides input signals to output modules 106, 108, 110, and 112, which in turn provide output positive polarity output signal 114, negative polarity output signal 118, and ground 118. With multiple isolated differential output modules wired in series, an amplifier can provide a selected output voltage. With exact gain matching it is acceptable to wire multiple output modules in parallel to produce a selected output current. Since there is no traditional negative feedback, the output modules would be completely stable providing twice the output current. These groups of modules can be wired in series, and parallel, to provide arbitrary voltage and current performance to match any impedance and drive needs with low voltage and low current devices in alternative embodiments.

Traditional loudspeaker applications can benefit from this approach. Amplifiers can have arbitrary drive characteristics. In particular, a stereo amplifier with two channels using output modules similar to those in the above example, with correct switching can couple the various output modules in series or parallel. As a result, the same amplifier can be a stereo amplifier, a mono high current amplifier for lower impedances, or a mono high voltage amplifier for high impedance loads. This same function can be extended with several amplifier embodiments. This allows a truly universal amplifier module, which can be used in almost any application, with a sufficient number of modules utilized.

These amplifier modules can be divided into two sections. The input stage, which can be either analog or digital in design, provides input interfacing, processing, and possibly signal gain. The output stage contains the output modules, which can also be driven by either analog or digital signals.

The analog input stage can be implemented using a very high performance gain-stage amplifier, a unity-gain buffer stage, a step-up transformer, or any combination of these. In any case it must properly drive the output modules of the design. A high performance input stage can be achieved using the following technology.

Figure 2:
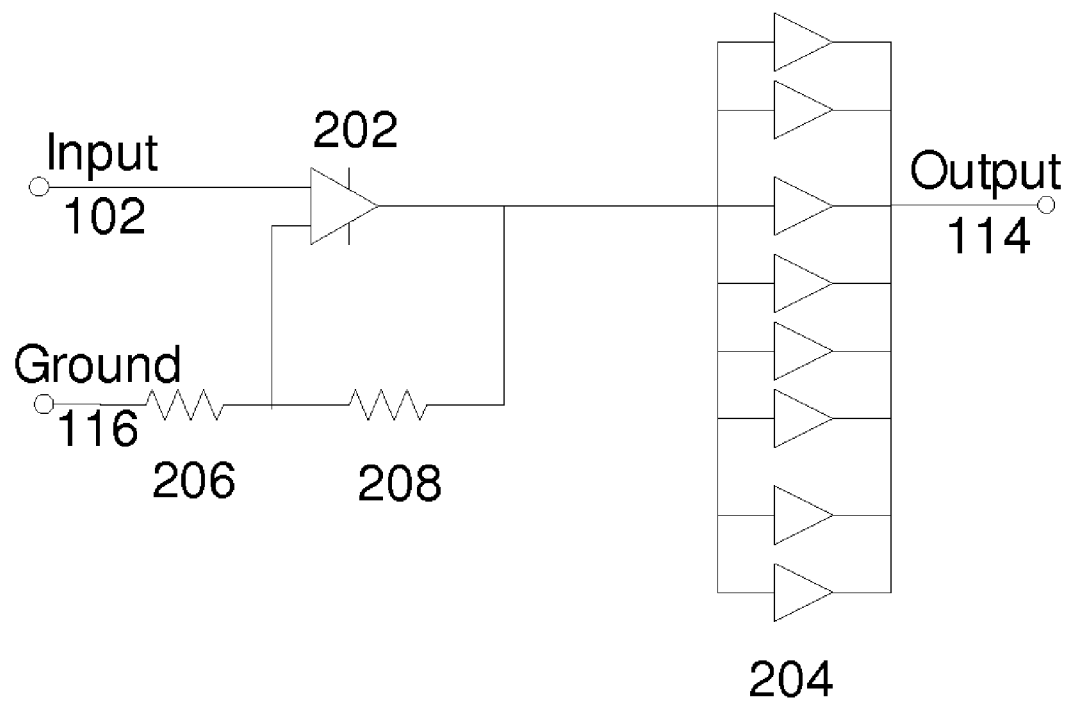
FIG. 2 illustrates the use of a gain stage amplifier module and a unity-gain buffer stage module, in accordance with one embodiment of the invention.

FIG. 2 illustrates the use of a gain stage amplifier module and a unity-gain buffer stage module, in accordance with one embodiment of the invention. Input signal 102 and ground 116 are the inputs to input stage operational amplifier 202, which in turn provides an input signal to a plurality of output modules 204, which in turn provides output positive polarity output signal 114. In one embodiment of the invention, the input gain stage amplifier is only used for voltage gain, and it is optimized for high impedance resistive output loading. The unity-gain buffer stage of the design is composed of a small to large number of ultra low distortion no-feedback buffer amplifiers wired in parallel. The input gain stage amplifier and the unity-gain buffer stage can be combined as shown in FIG. 2.

The voltage gain input amplifier can utilize many different traditional technologies and topologies. Both solid state and tube circuits can be used for voltage amplification. Because this circuit drives the high impedance inputs of the buffer amplifiers, the input voltage gain stage amplifiers can be very carefully tailored for linear voltage performance into a resistive load.

Figure 3:
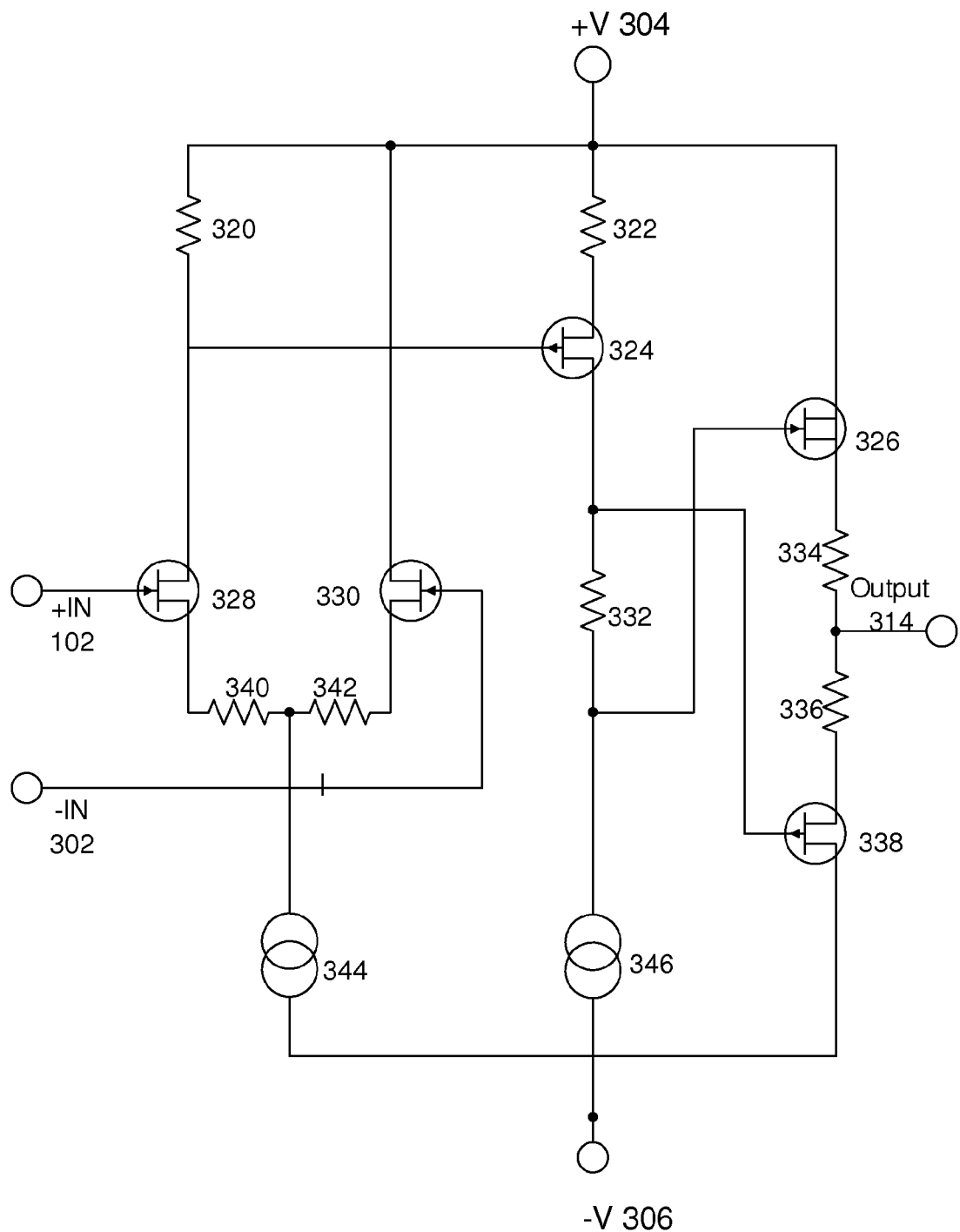
FIG. 3 illustrates the use of a gain stage amplifier including a symmetrical Class-A differential amplifier, in accordance with one embodiment of the invention.

FIG. 3 illustrates the use of a gain stage amplifier including a symmetrical Class-A differential amplifier, in accordance with one embodiment of the invention. Positive polarity input signal 102 and negative polarity input signal 302 are inputs to JFETs 328 and 330, respectively. A positive voltage supply 304 and a negative polarity supply 306 energize the amplifier circuit including resistors 320, 322, 332, 334, 336, 340, and 342; JFETs 324, 326, 338, and current sources 344 and 346, which in turn provide output signal 314. When matched complimentary JFETs are used in the design, a very linear, high performance voltage gain stage is achieved without negative feedback.

Any negative feedback used around this embodiment will only further linearize the amplifier. Because this amplifier does not have slow high current output devices in the feedback loop or high capacitive loading, there is very little propagation time through the amplifier, which can enlarge dither or overshoot effects in the signal.

Figure 4:
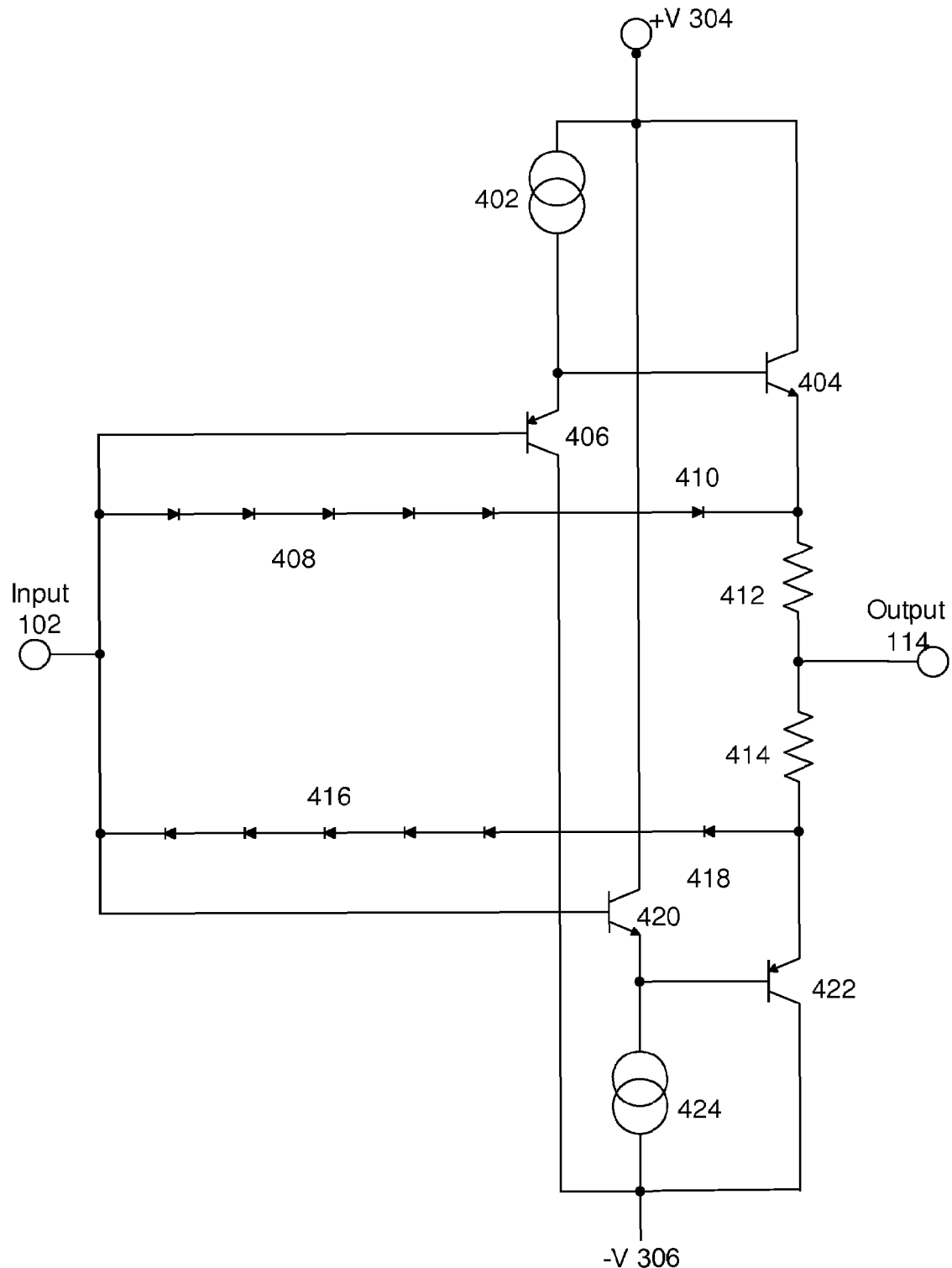
FIG. 4 illustrates a buffer amplifier for the output drive stage that contain a complimentary pair of complimentary emitter followers to provide a high performance, no voltage gain, current amplifier, in accordance with one embodiment of the invention.

FIG. 4 illustrates a buffer amplifier for the output drive stage that contain a complimentary pair of complimentary emitter followers to provide a high performance, no voltage gain, current amplifier, in accordance with one embodiment of the invention. Positive polarity input signal 102 is an input to the bases of bipolar transistors 406 and 420. A positive voltage supply 304 and a negative polarity supply 306 energize the amplifier circuit including current sources 402 and 424; bipolar transistors 404, 406, 420; resistors 412 and 414; and diode groups 408, 410, 416, and 418; which in turn provide output signal 114. Series resistors 412 and 414 are wired in the output of the output transistors 404 and 422 for linearization and output current limiting. These current limit resistors 412 and 414 protect the amplifiers, but prevent the high damping factors (low output impedance) needed for high fidelity operation. By utilizing a large number of these amplifiers in parallel the effective damping factor can be as high as that obtained with large amounts of negative feedback in traditional output circuits. Since each amplifier is relatively low power, the transistors in the amplifiers output stage have more ideal characteristics. In particular, the current in the collectors varies little with differences in collector voltages. As a result, power supply isolation and output linearity are much better than if a small number of large geometry output devices are used. The small geometry output devices also have much better high frequency performance than large geometry power devices. In one embodiment hundreds of these output buffers can be used.

A large number of buffer amps in parallel will also generate the very high currents needed to drive large capacitive loads of electrostatic transducers and any step-up transformers used to generate the high drive voltages required in this application. Because the buffer amplifiers can be monolithic devices, the cost of the entire amplifier can be competitive. Discrete device buffer amplifiers can also be utilized in alternative embodiments that are especially appropriate in high-voltage direct drive applications.

In alternative embodiments, the output buffers can be implemented with conventional operational amplifiers wired in a unity-gain configuration. There are several monolithic amplifiers that have high output current and acceptable performance, which can be suitable for this design. This configuration is also applicable in high voltage drive applications where the dither of the unity-gain feedback can be proportionally smaller because of the high drive voltages and the potentially small amount of dither. These amplifiers might need a series resistor in their output for stability when the amplifiers are coupled in parallel, but as with the buffer amplifiers, when a large number of them are used the output impedance will drop to acceptable levels. The output impedance determines the damping factor of an amplifier, which is the ratio of the output impedance of the amplifier to the load impedance. A damping factor of 100 to 1 with an eight-ohm load means the effective output impedance of the amplifier is one-twelfth of an ohm. This is usually considered pretty good performance. The wire impedance connecting the load can be this high. High performance amplifiers can have damping factors as high as 200 or more.

If the input stage needs to provide higher output voltages, a low power audio step-up transformer can be used as a no-feedback voltage gain stage. The loading of the following output modules can be quite low (high impedance) so this transformer can be low power and high impedance, which makes it easier to make, better performing, and lower cost. This transformer, with and without input and output buffer amplifiers, can be the only voltage gain of the amplifier. Since this transformer can have multiple secondary winding outputs, this approach can also provide the isolation needed for the output modules. The output modules could then only need to contain power supplies and buffer amplifiers.

An input stage can also consist of an ADC circuit which digitizes the analog input and provides it through the digital input methods described below to give digital processing advantages to a amplifier provided with analog input voltages. The processed signal can be converted back to analog to drive analog output modules or directly drive digital output modules mentioned below.

Digital Input Module

Figure 5:
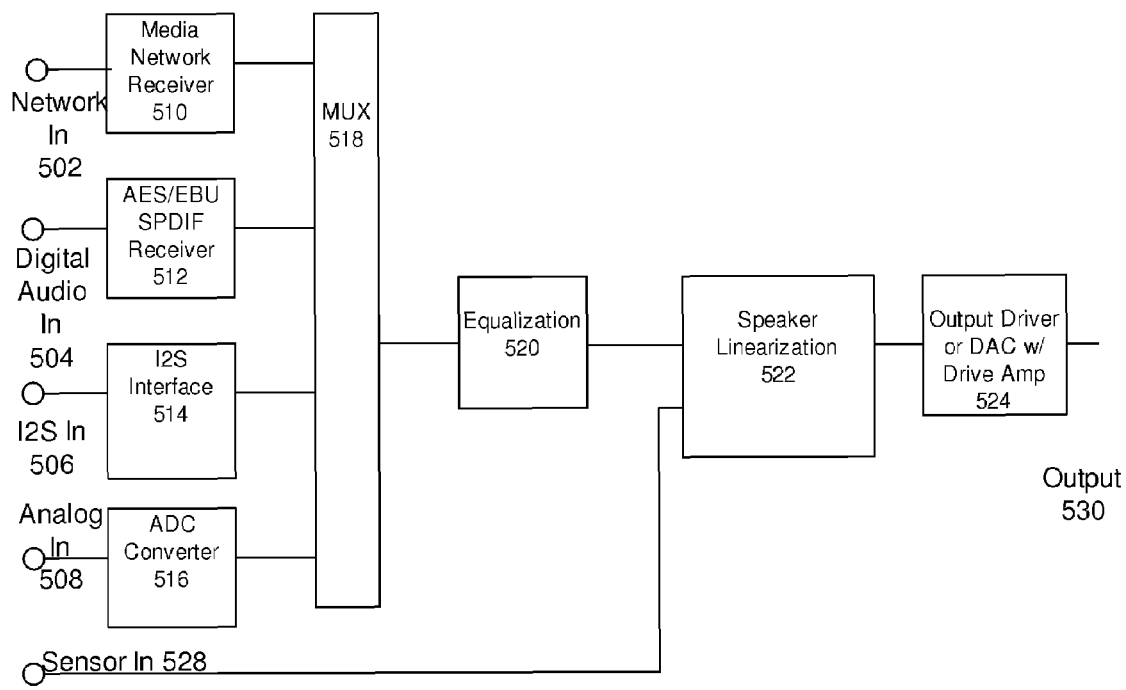
FIG. 5 illustrates the use of a digital application input stage, in accordance with one embodiment of the invention.

FIG. 5 illustrates the use of a digital application input stage, in accordance with one embodiment of the invention. Network In 502 is an input to Media Network Receiver 510; Digital Audio In 504 is an input to AES/EBU SPDIF Receiver 512; I2S In 506 is an input to I2S Interface 514; and Analog In 508 is an input to Analog-to-Digital Converter (ADC) 516. AES/EBU is an acronym for the Audio Engineering Society/European Broadcast Union, which established the basic professional stereo digital audio data distribution format. SPDIF is an acronym for the Sony Philips Digital Interface Format, which is the consumer version of the AES/EBU standard. I2S is an acronym for IIS which is the nomenclature for a specific internal digital audio data format. These modules in turn provide inputs to Mux module 518, which provides an input to the Equalization module 520. Speaker Linearization module 522 receives inputs from the Sensor In 528 and Equalization module 520, and provides an input to an Output Driver or a Digital-to-Analog Converter (DAC) w/Drive Amp module 524, which in turn provides an output 530. In digital applications, the input stage can provide:

AES/EBU, SPDIF and/or network data reception

Digital signal processing for equalization and crossover functions

Digital feedback and processing for speaker and amplifier correction

Drive circuitry for opto-isolator inputs of Digital Output Modules

DAC and drive electronics for Analog Output Modules

Several of these functions can also exist in the digital output modules. They are listed here for their global function.

The linearization processing techniques applicable here are mentioned below. They would be used here for linearizing loudspeaker characteristics, for example. With a Digital Input Stage, the high voltage DAC output module design described below in Digital Output Modules can be used as the output circuit for the Digital Input Stage when driving Analog Output Modules. A step-up transformer with multiple secondary winding outputs connected to the analog output of this module can be used to help lower system costs, as mentioned above. A traditional DAC design driving the Analog Input Stage mentioned above will also perform well as a Digital Input Stage driving Analog Output Modules.

In one embodiment, the output modules are electrically isolated from the chassis. The audio signal can be communicated to the module in either analog or digital format. Either transformers or opto-isolators can act as isolation devices to provide the voltage isolation required for either digital or analog amplifiers. In one embodiment, transformers are also used to couple operating power into the modules and provide the necessary voltage isolation.

Analog Output Module

Figure 6:
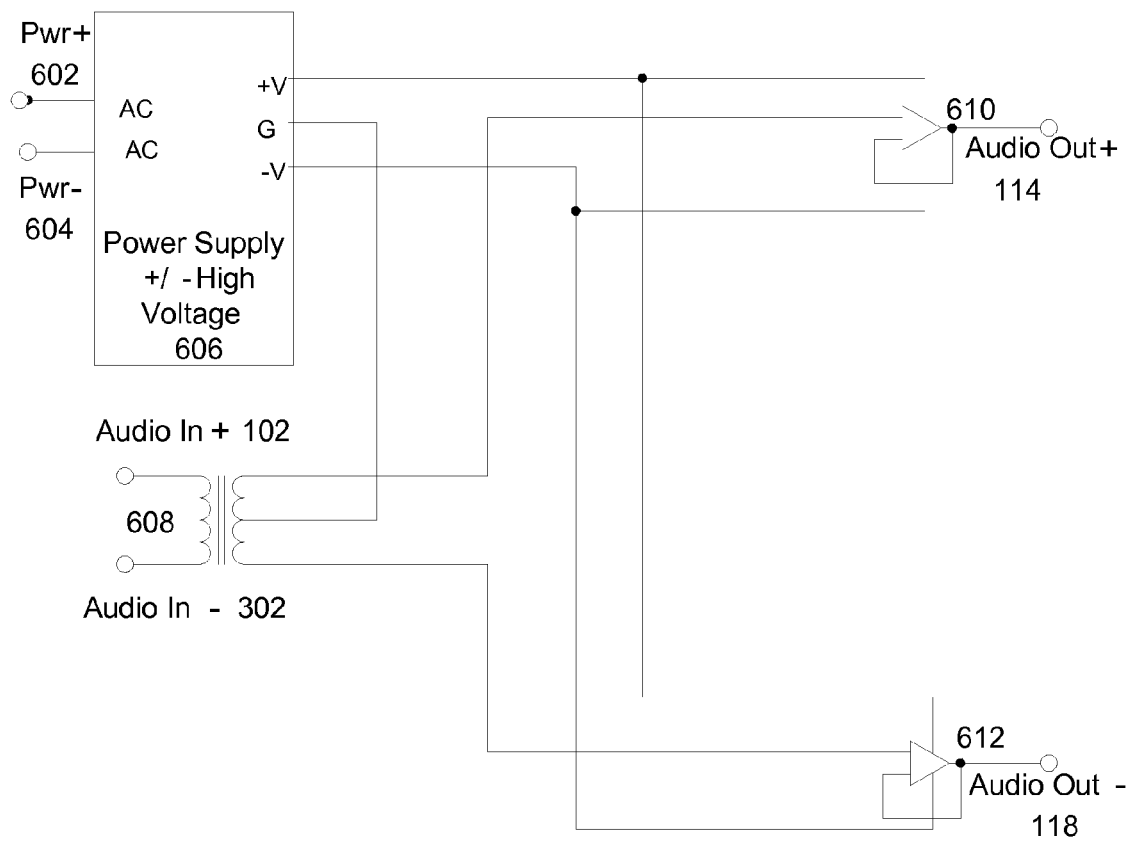
FIG. 6 illustrates an analog drive output module using isolation transformers to communicate the analog audio signal in a transformer based output module, in accordance with one embodiment of the invention.

FIG. 6 illustrates an analog drive output module using isolation transformers to communicate the analog audio signal in a transformer based output module, in accordance with one embodiment of the invention. Positive polarity input signal 102 and negative polarity input signal 302 are inputs to transformer 608. Positive AC power source 602 and negative AC power source 604 energize Power Supply +/−High Voltage 606, which provides positive and negative polarity voltages to amplifiers 610 and 612, which provide positive and negative audio outputs 114 and 118, respectively.

This output module can have both voltage and current amplification, or just current amplification. The most economical and highest performance approach is to have a common voltage gain amplifier for all the modules and only perform current amplification in each output module. Voltage amplification can also be provided by a step-up input transformers which would provide both voltage gain and voltage isolation. This would allow the common drive electronics in the input stage to run at lower voltages and to relegate the potentially higher voltages to the output modules. There could be some performance degradation from this transformer step-up function, but it would be much less than that of a standard electrostatic step-up output transformer, because it does not have to drive high capacitive loads.

The current driving output section needs to be a very low distortion, very high speed, high voltage drive design that provides high output current. These four attributes can be very hard to provide at one time. Since the output amplifiers can be operational amplifiers wired as unity-gain devices, or can be single or paralleled high voltage versions of the buffer amplifiers described above, this design can have low artifacts normally not occurring in high voltage-gain circuits.

Figure 7:
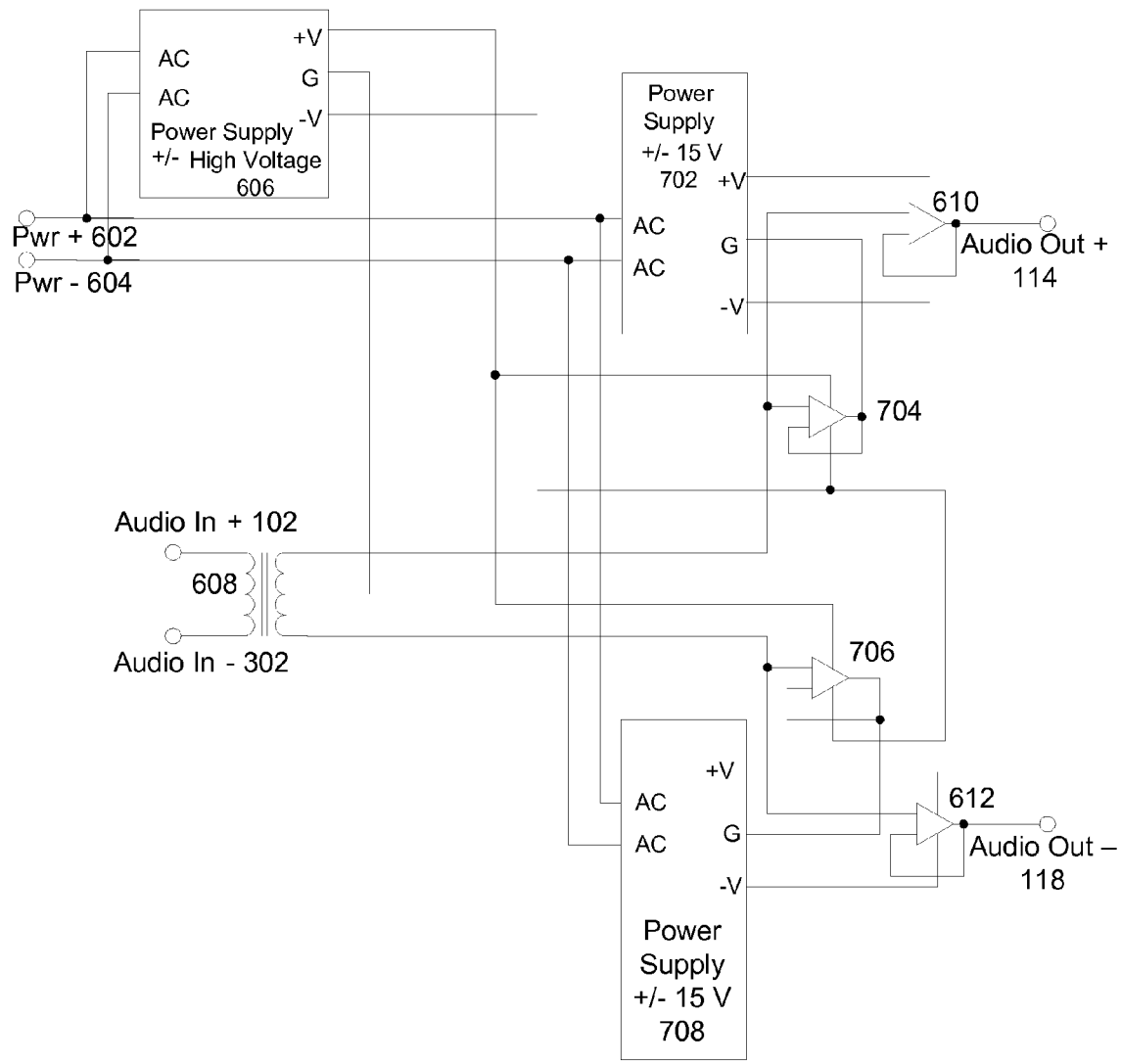
FIG. 7 illustrates an output drive function split into two phases by a transformer based output module, in accordance with one embodiment of the invention.

FIG. 7 illustrates an output drive function split into two phases by a transformer based output module, in accordance with one embodiment of the invention. Positive polarity input signal 102 and negative polarity input signal 302 are inputs to transformer 608. Positive AC power source 602 and negative AC power source 604 energize Power Supply +/−High Voltage 606, which provides positive and negative polarity voltages to amplifiers 704 and 706. Power supply +/−15 V modules 702 and 708 provide positive and negative voltages to amplifiers 610 and 612, which provide positive and negative audio outputs 114 and 118, respectively.

The first stage is a very fast and high current amplifier. In effect, it provides the voltage offset for the actual output drive circuit. The output drive circuit consists of a second output circuit along with its power supply. This second stage is a very fast and low distortion, low voltage buffer amplifier. This buffer amplifier is only used to provide the actual output signal over a very small voltage range. It can be identical to the parallel buffer amp technology mentioned in the analog input stage section above. Because this buffer is much faster than the voltage drive amplifier that biases it, it is capable of correcting for any errors present in the high voltage drive section.

This buffer amp also has excellent common mode and power supply rejection, which also helps isolate errors that the voltage drive amp may have. One embodiment of the invention uses a buffer amp that does not utilize negative feedback, so there is no fidelity degradation from feedback hunting or overshoot even if the high voltage amplifier has these characteristics. A more traditional low voltage operation amplifier wired in a unity-gain configuration can also be used as this buffer amplifier. Multiples of them can be wired in parallel as described previously.

Digital Output Module

Figure 8:
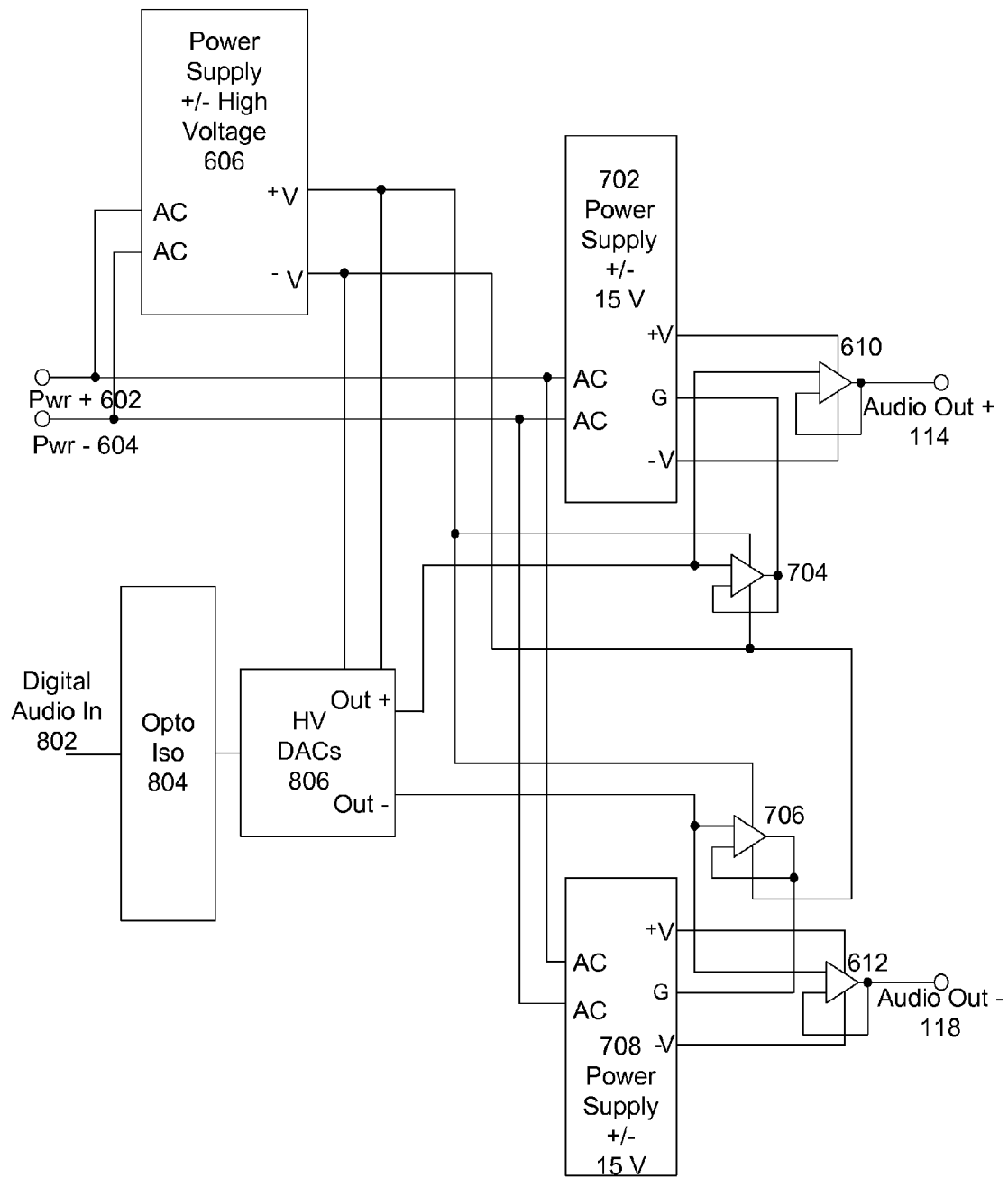
FIG. 8 illustrates digital audio available as a source, where the input voltage isolation is provided with one or more digital opto-isolators in an opto-isolator based module, in accordance with one embodiment of the invention.

FIG. 8 illustrates digital audio available as a source, where the input voltage isolation would be provided with one or more digital opto-isolators in an opto-isolator based module, in accordance with one embodiment of the invention. Digital Audio In signal 802 is an input to Opto-Isolator module 804, which provides an input to high voltage HV DACs module 806. Positive AC power source 602 and negative AC power source 604 energize Power Supply +/−High Voltage 606, which provides positive and negative polarity voltages to HV DACs module 806 and to amplifiers 704 and 706. Power supply +/−15 V modules 702 and 708 provide positive and negative voltages to amplifiers 610 and 612, which provide positive and negative audio outputs 114 and 118, respectively.

With digital source material, the output module will be responsible for both the conversion of the digital signals to analog and the amplification of this analog signal to the levels needed for the output current buffers. One embodiment would utilize a DAC and a traditional low voltage power amplifier, like the one mentioned above for the analog input stage. It would amplify the voltage and current of the DAC and drive a step-up transformer for the bulk of the voltage gain required. As mentioned previously, this transformer would not have to drive heavy loads so it would not have to be as large and expensive as traditional output transformers.

Digital Amplifier Linearization

A second approach would utilize the power of digital processing to create an amplifier design that is difficult to implement using other techniques. One embodiment utilizes a digital lookup or error simulation circuit to linearize a simple single active device voltage amplifier stage (this is only an example, because in other embodiments, a group of multiple amplifier devices can be linearized in a similar manner), which has very consistent and predictable distortion characteristics. Digital pre-distortion of the input to the device is used to effectively correct this device's inherent non-linearities. This approach does not use negative feedback in the traditional sense, so it does not have the detrimental effects on audio, mentioned above. In another embodiment it can include a feedback mechanism, which continually monitors the output of the amplifier to compensate for temperature, load, and aging drift of the device. The voltage amplifier device in various embodiments is a bipolar transistor, MOS-FET device, or a vacuum tube. The correction circuit can correct for linearity and time-based devices like capacitance and non-linear capacitance. In one embodiment, the correction circuit can correct multiple grouped devices.

Figure 9:
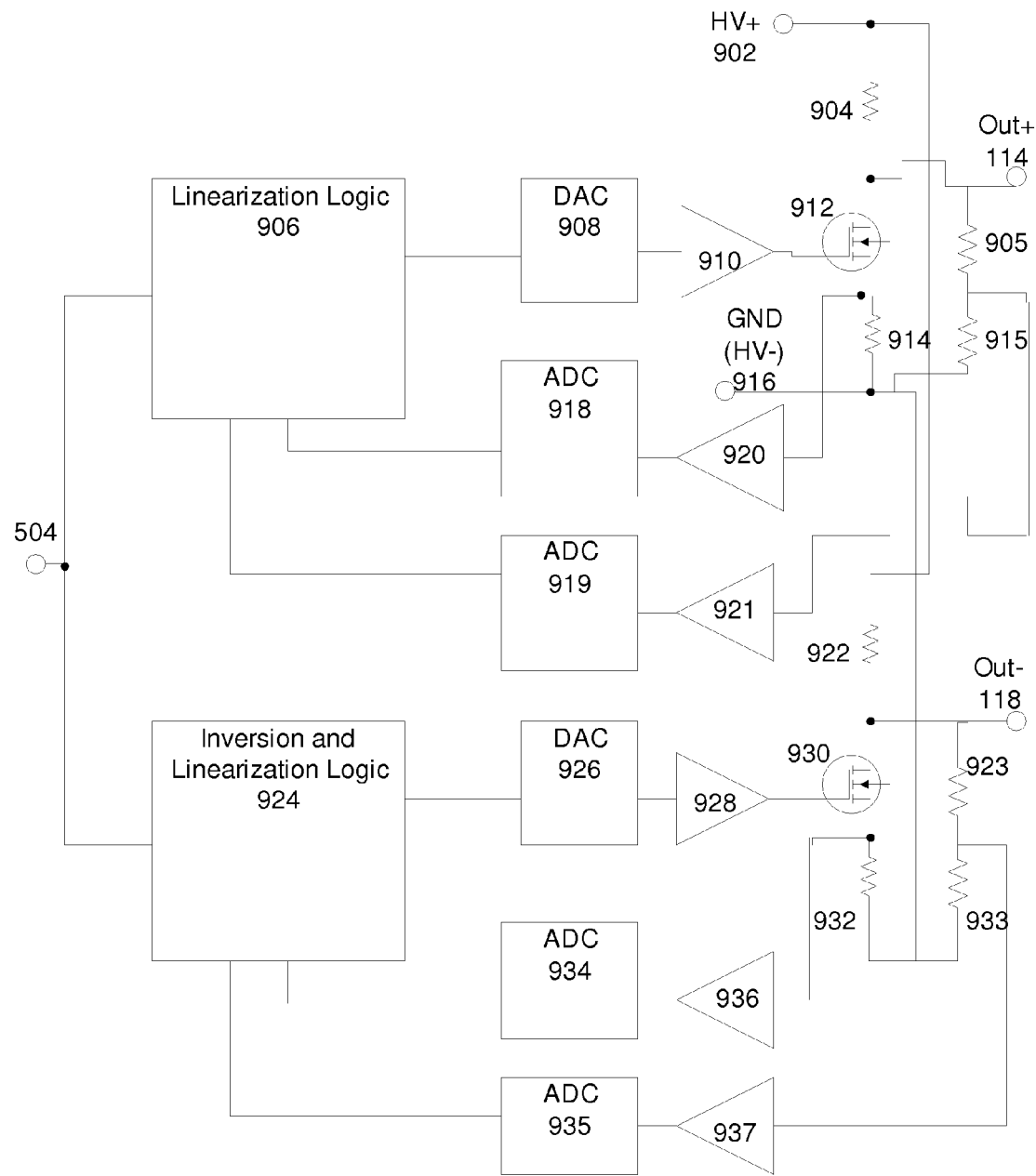
FIG. 9 illustrates a digital correction circuit's topology, in accordance with one embodiment of the invention.

FIG. 9 illustrates a digital correction circuit's topology, in accordance with one embodiment of the invention. Digital Audio input signal 504 is an input to the Linearization Logic module 906 and the Inversion and Linearization Logic module 924. Linearization Logic module 906 is coupled to DAC 908, ADC 918 and ADC 919. Inversion and Linearization Logic module 924 is coupled to DAC 926, ADC 934 and ADC 935. Output buffers 910 and 928 are coupled to DAC 908 and DAC 926, respectively. Input buffers 920, 921, 936 and 937 are coupled to ADC 918, ADC 919, ADC 934 and ADC 935, respectively. A positive voltage supply 902 and a negative polarity voltage supply 916 energize the amplifier circuit including transistors 912 and 930; and resistors 904, 905, 914, 915, 922, 923, 932, and 933; which in turn provide positive and negative polarity output signals 114 and 118. The resistors 904, 905, 914, 915, 922, 923, 932, and 933 provide linearization and output current limiting.

In another embodiment, voltage divider resistors 905, 915, 923, and 933 can be deleted, and the input to buffer 921 can be directly connected to the positive polarity output signal 114, and the input to buffer 937 can be directly connected to the negative polarity output signal 118. The feedback circuit consists of ADCs 918, 919, 934, and 935 having a resolution equal to or higher than the resolution needed in the application. This embodiment provides an output monitor signal to a comparison circuit that compares it with the properly delayed DAC input signal and generates a difference value. In one embodiment, there would be monitoring ADC converters for both output voltage and current.

Lookup Table Linearization

Figure 10:
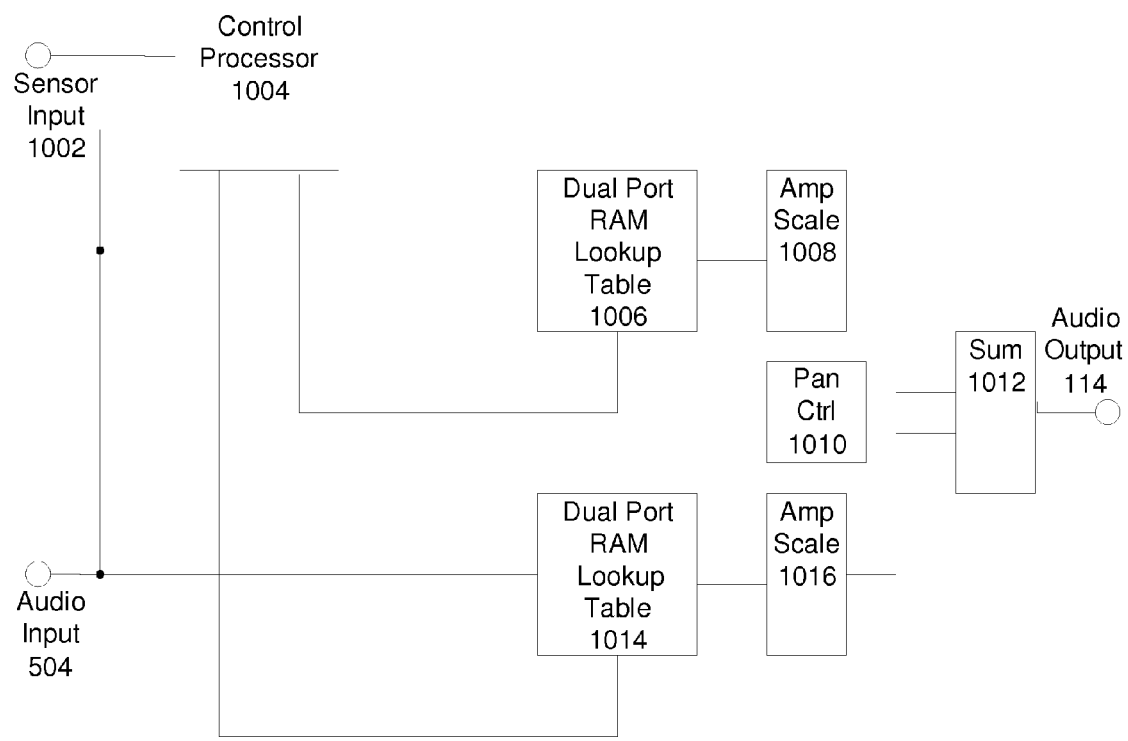
FIG. 10 illustrates another embodiment with lookup table linearization, in accordance with one embodiment of the invention.

FIG. 10 illustrates another embodiment with lookup table linearization, in accordance with one embodiment of the invention. Control Processor module 1004 receives input signal 1002 and digital audio input signal 504; and provides inputs to the Dual Port RAM Lookup Table modules 1006 and 1014. Amp Scale modules 1008 and 1016 receive inputs from Pan Control module 1010, and produce an output signal from the Summing module 1012, which produces the audio output 114. Here the difference value discussed above, or a fraction of it, can be added into a RAM lookup correction table residing between the source data and the DAC.

If the values are simply inserted in the active lookup table, there will be glitches in the output signal. If two lookup tables are used with a simple gradual "pan" between the two outputs of the two tables, then there will be no discontinuities on the output when the switch occurs. A pan is achieved by the gradual shifting of complimentary amplitude scaling of the two outputs and final summing. This pan has to occur slowly enough so that it does not introduce an audible thump. In one embodiment of the invention, a pan time of a major part of a second is usually appropriate and sufficient.

When a lookup table is updated it will be for a small number of values of the table. If only a single value is changed, then a glitch in the output will occur when the signal references this point. With the use of a smoothing operation like a quadratic or spline function, the table and all its neighboring values can be updated while maintaining a continuous function in the table. The nature of this smoothing can be varied for different parts of the table. In some embodiments, higher performance is achieved by shifting the whole table by a constant to offset it, rather than by updating small parts of the table. For example, this is appropriate when compensating for temperature shifts of device parameters. The net effect of implementing all of these techniques is to create a new table using a few points, such that the table develops a more accurate overall performance.

Inverse Simulation Linearization

An alternative embodiment would include an inverse simulation model of the individual elements of the device in the circuit to be corrected. By passing the input signal through this model before passing it on to the DAC and the device, the negative effects of the device can effectively be removed. The full inverse simulation would usually occur for each sample of the audio.

Figure 11:
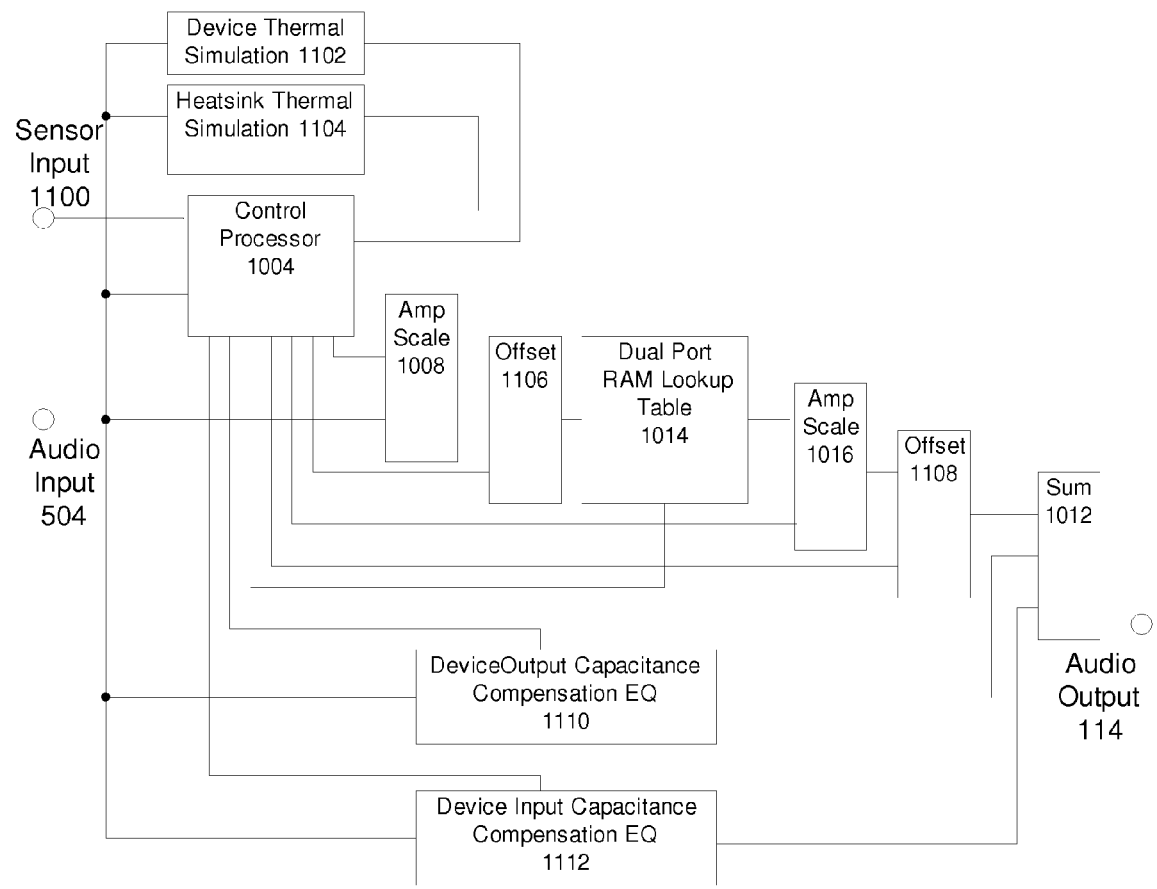
FIG. 11 illustrates a circuit to use inverse simulation linearization, in accordance with one embodiment of the invention.

FIG. 11 illustrates a circuit to use inverse simulation linearization, in accordance with one embodiment of the invention. The inverse simulation can be performed using a control processor (e.g., a DSP, a general-purpose processor, or an equivalent processor). Control Processor module 1004 receives sensor input signal 1100 and digital audio input signal 504; and provides inputs to the Device Thermal Simulation module 1102, Heatsink Thermal Simulation module 1104, Amp Scale module 1008, Offset module 1106, Dual Port RAM Lookup Table module 1014, Amp Scale modules 1016, Offset module 1108, DeviceOutput Capacitance Compensation Equalization module 1110, and Device Input Capacitance Compensation Equalization module 1112. Modules 1108, 1110, and 1112 provide inputs to the Summing module 1012, which produces the audio output 114.

In one embodiment, an inverse simulation model consists of an exact compliment of each of the simulation devices used to normally simulate that device in an engineering simulation program (e.g., such as SPICE, or other equivalent programs). Many correction elements can also be performed by signal processing techniques. As a result, any distortion effects, capacitances, inductances, or resistances intrinsic in the part would be compensated for by the inverse functions in the inverse model. By slowly adjusting each of the parameters of the inverse model and monitoring the actual device output as described above, it is possible to minimize the amplifier distortion.

In one embodiment, an annealing effect can be applied by scaling this continual adjustment. The annealing process is achieved by initially providing large changes ("high heat") to the correction. As the performance improves, the circuit reduces the size of the corrections ("lower heat"). In this embodiment, when the amplifier starts up, these parameters could be adjusted over a relatively wide range. As the amplifier error becomes less, then the size of the variations is decreased until the parameter variations are adequate to maintain a very low distortion. Initial values can be remembered from previous corrections and preset into the circuit on startup so that the correction process is always adjusting for smaller variations in the model. Initial start up parameters can also be generalized or remembered from actual measurements of the amplifying device during units manufacturing and calibration.

The simulation illustrated in the figure above shows many of the elements needed for simulating devices such as bipolar transistors or MOSFETS. The input scaling and offset units are set by the Control Processor to modify the input signal and match it to the log or square root like function loaded into the lookup table. The function in the table can also be updated, but many applications only need to modify the table access and global parameters of the data coming from the table. The scaling and offset factors on the data read from the table help match the table's contents to the particular device in the circuit. The two equalized and delayed signals that are summed with the table output compensate for the effects of the internal device capacitances. These capacitances will remove high frequency energy. The two band-pass filters add that energy into the input of the device to compensate for and remove the effect. The two thermal simulation modules compute the power dissipation of the device and the temperature influences the heating of the chip and package will have on the operation of the device. The Control Processor can modify the inverse simulation parameters to compensate for the device parameter changes as it is being heated by its operation.

Composite Amplifier Topologies

The linearized amplifier with isolation disclosed above can be used as an active device in various amplifier topologies. The amplifier discussed above is a simple Class A design. In one embodiment, two of these circuits wired in series between two power supply sources, driven with a coordinating digital processing section, can be used as a push-pull Class B or Class AB design.

Figure 12:
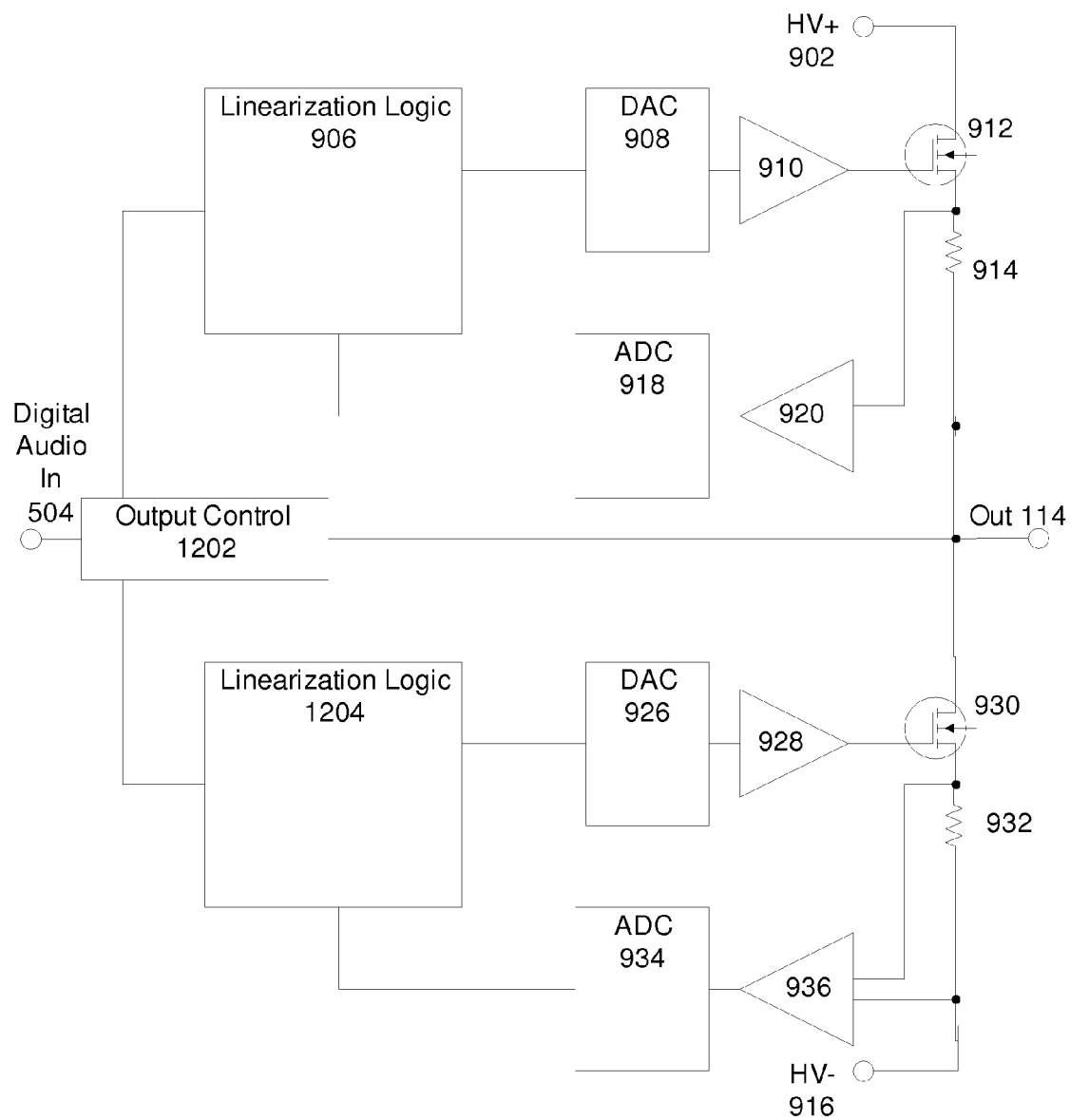
FIG. 12 illustrates a Class AB amplifier, in accordance with one embodiment of the invention.

FIG. 12 illustrates a Class AB amplifier, in accordance with one embodiment of the invention. Digital Audio input signal 504 and output voltage and current are inputs to the Output Control module 1202, which provides inputs to the Linearization Logic module 906 and the Linearization Logic module 1204. The output voltage and currents are measured by ADC converters integrated with the Output Control module 1202 and the Linearization Logic module 906. Linearization Logic module 906 is coupled to DAC 908 and ADC 918. Linearization Logic module 1204 is coupled to DAC 926 and ADC 934. Output buffers 910 and 928 are coupled to DAC 908 and DAC 926, respectively. Input buffers 920 and 936 are coupled to ADC 918 and ADC 934, respectively. A positive voltage supply 902 and a negative polarity voltage supply 916 energize the amplifier circuit including transistors 912 and 930; resistors 904, 914, 922 and 932; which in turn provide positive and negative polarity output signals 114 and 118.

The monitoring of the performance of the linearized device gives the correction circuit the actual output current of the circuit element. The coordinating Output Control circuitry would only have to specify the instantaneous current of the linearized device at a regular interval to coordinate its contribution to the circuit. In various embodiments, these linearized devices can be wired in series to provide higher voltage operation, and/or they can be wired in parallel to deliver higher drive current. In one embodiment, the contributions of various devices can be switched on and off, as the need exists to reduce power dissipation or dynamically improve speed.

Loudspeaker Linearization

In one embodiment of the invention, the linearization techniques disclosed above can also be applied to a loudspeaker. A sensor, or microphone built into the loudspeaker can give feedback to the linearization circuits similar to those discussed above. Measurements of specific parameters of the speaker, like diaphragm displacement, might be used as a stimulus for a global distortion correction circuit.

One issue that occurs when measuring speaker position for correction systems is the potential interference from ambient room noise and other speakers. In one embodiment, one solution to this problem is to use a digital convolver to extract the source audio from the returned signal from the sensor. Accumulating the products of the two signals over a sequence of samples performs the convolution. When the input signal is correctly synchronized with the return signal, the sum of the products will increase dramatically. The height of this sum gives the correlation of the input and output signals.

In general, this sum of products does not give much more information than the amplitude of the detected signal. If the source signal is band-pass filtered before the convolution, then the height of the correlation will give the amplitude of that band of the signal. By using various band-pass center frequencies and bandwidths, the overall frequency response of the speaker can be determined. Since the response of the speaker is in many cases related to the room response, this correlated response detection can also help correct for room responses. This is easier to do if the actual response of the speaker is measured during manufacturing in a neutral room and this response is compared with the sensed return.

In many situations, the distortion of the speaker increases as the amplitude increases. This normally occurs only at lower frequencies. In one embodiment, by band-pass filtering the input signal and then frequency multiplying the resultant signal by two and three times, the convolution will allow the harmonic distortion to be measured selectively at second and third harmonics. By comparing these correlations at different levels, the distortion in regard to amplitude can be accurately measured. In one embodiment, this distortion measurement can be used to modify an inverse model simulation of the loudspeaker to pre-distort the signal to eliminate the effect of the transducers nonlinearities. By using the annealing technology disclosed above, this correction can be done continually while the speaker is playing.

In one embodiment of the invention, this correction can be utilized for correcting distortions created by manufacturing errors and for basic transducer nonlinearity characteristics. In order to correct for these errors, substantially exact speaker diaphragm displacement must sometimes be determined. In one embodiment, this is performed by looking at the second and third harmonic distortion of the speaker as the amplitude changes. Second harmonic distortion sometimes comes from asymmetric drive. Third harmonic distortion can come from clipping or symmetric distortion. Since the actual displacement is the result of the drive voltages, cabinet, and ambient influences, it cannot be determined just by dynamic modeling. In one embodiment, the accurate measurement of the distortion using the convolution techniques disclosed above can be used to verify and correct the simulation of the diaphragm.

Digital Clocking

For the best fidelity, the clock used by the output DAC must be extremely stable. There are several approaches to stabilize this clock. One embodiment would use a dedicated reference oscillator on each output module along with a sample rate converter. The sample rate converters would need to be synchronized at startup to lock the audio signal synchronization between all of the modules. Another embodiment would use a clock transmitted from a stable input clock to each module by a high-speed opto-isolator designed to introduce a minimum amount of jitter.

Isolation Capacitance

Each of the output modules needs their own isolating power sources. This can be achieved with 60/50 Hz line frequency power transformers, standard bridge rectifiers, capacitors, and analog voltage regulation. Another embodiment would use a switching power supply with a high frequency isolation transformer. The output voltage can be regulated with the switching circuitry. Switching power supplies would be smaller, lighter, and could have better low frequency performance. The smaller transformer used in switching power supplies would have lower capacitance between windings, and it might be easier to make this capacitance highly linear.

With all of the voltage isolation techniques used in these amplifier approaches, it is important to design them to have extremely low and stable coupling capacitance. All of this capacitance will appear to be in parallel with the electrostatic transducer capacitance. Most speakers at the present time have a capacitance of around 1000 pf. All of the capacitance from the isolation devices should add up to less than this amount. Any non-linearities in this capacitance, which is a function of changes in capacitance as the applied voltage changes, will cause nonlinear loading on the output of the amplifier. This loading can be overcome by higher damping factors and higher current drive of the output modules, and by careful design of the isolation circuitry to eliminate these variations.

Figure 13:
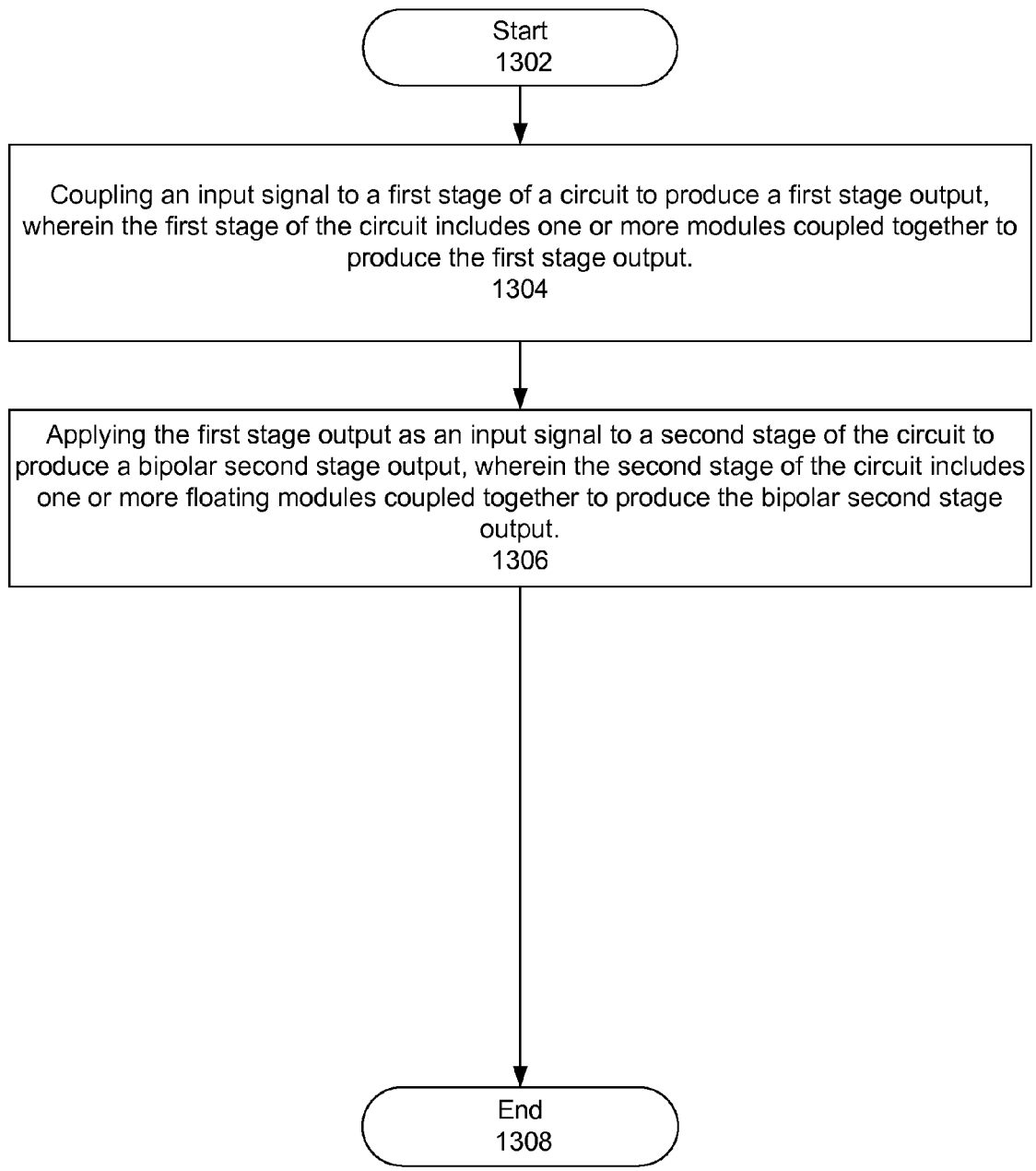
FIG. 13 illustrates a flowchart of a method to produce a bipolar output signal from a circuit having at least two stages, according to one embodiment of the invention.

FIG. 13 illustrates a flowchart of a method to produce a bipolar output signal from a circuit having at least two stages, according to one embodiment of the invention. The sequence starts in operation 1302. Operation 1304 includes coupling an input signal to a first stage of a circuit to produce a first stage output, wherein the first stage of the circuit includes a first plurality of modules coupled together to produce the first stage output. Operation 1306 includes applying the first stage output as an input signal to a second stage of the circuit to produce a bipolar second stage output, wherein the second stage of the circuit includes a second plurality of floating modules coupled together to produce the bipolar second stage output. The method ends in operation 1308.

Figure 14:
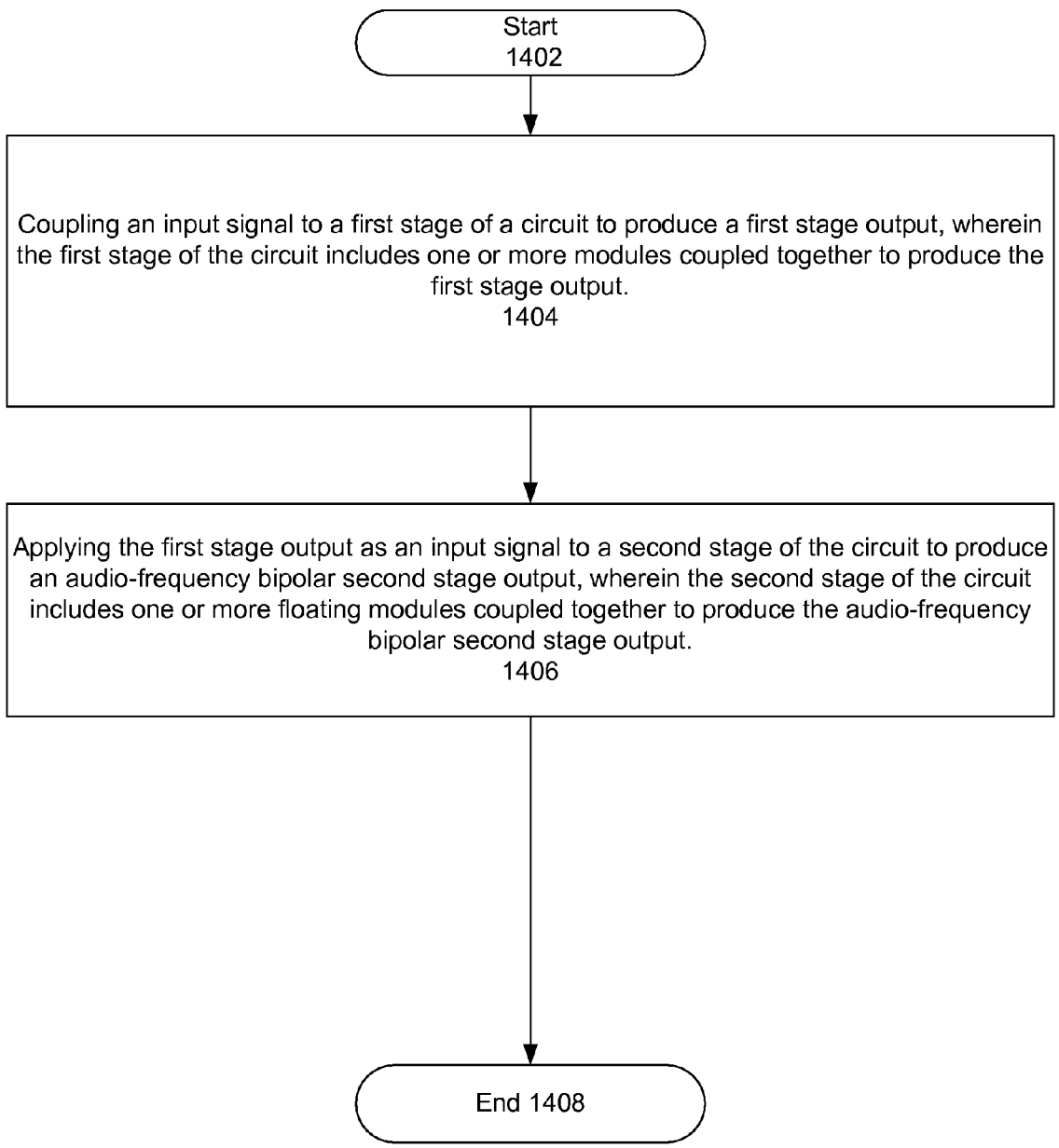
FIG. 14 illustrates a flowchart of a method to produce an audio-frequency bipolar output signal from a circuit having at least two stages, according to one embodiment of the invention.

FIG. 14 illustrates a flowchart of a method to produce an audio-frequency bipolar output signal from a circuit having at least two stages, according to one embodiment of the invention. The sequence starts in operation 1402. Operation 1404 includes coupling an input signal to a first stage of a circuit to produce a first stage output, wherein the first stage of the circuit includes a first plurality of modules coupled together to produce the first stage output. Operation 1406 includes applying the first stage output as an input signal to a second stage of the circuit to produce an audio-frequency bipolar second stage output, wherein the second stage of the circuit includes a second plurality of floating modules coupled together to produce the audio-frequency bipolar second stage output. The method ends in operation 1408.

Figure 15:
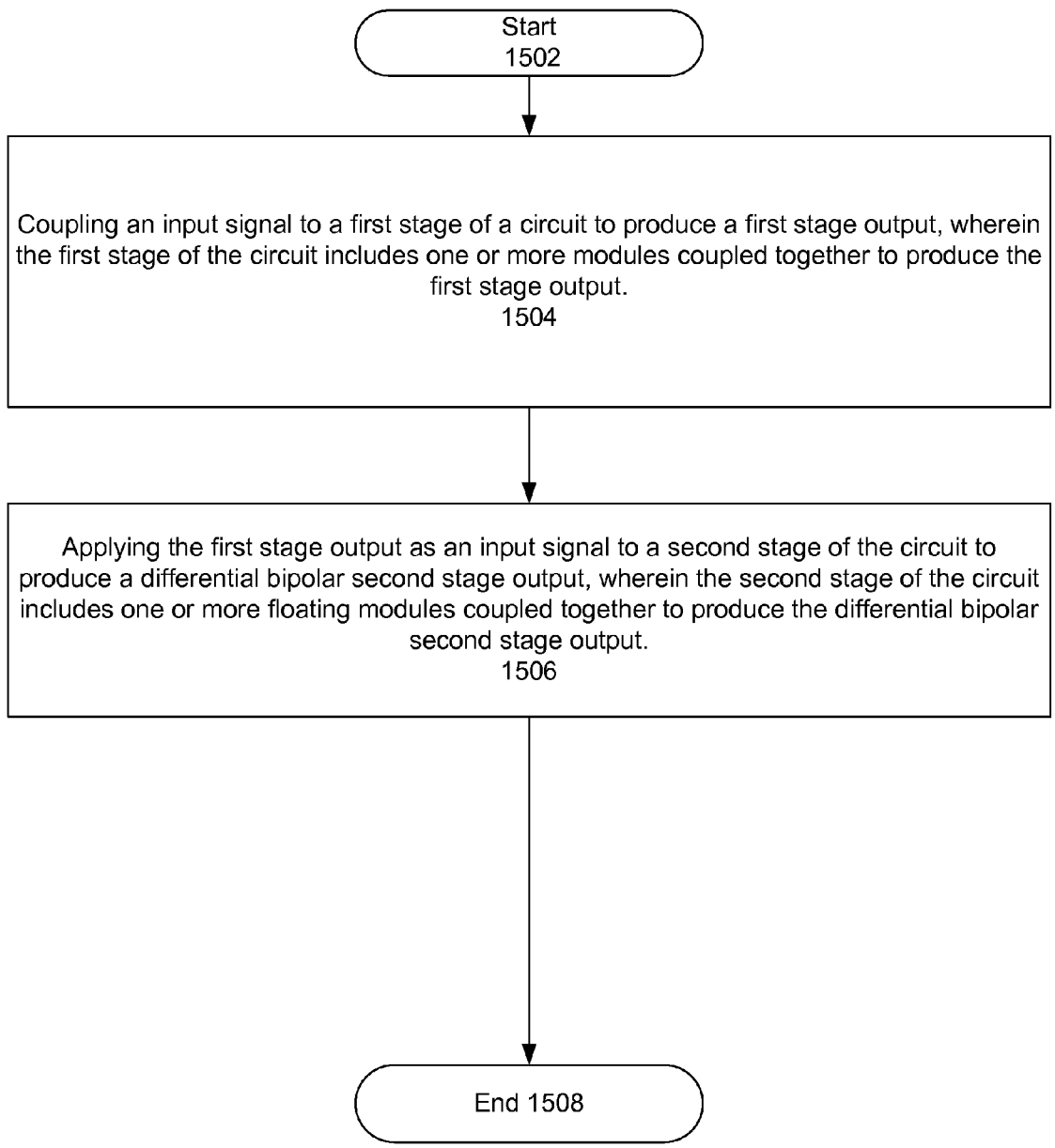
FIG. 15 illustrates a flowchart of a method to produce a differential bipolar output signal from a circuit having at least two stages, according to one embodiment of the invention.

FIG. 15 illustrates a flowchart of a method to produce a differential bipolar output signal from a circuit having at least two stages, according to one embodiment of the invention. The sequence starts in operation 1502. Operation 1504 includes coupling an input signal to a first stage of a circuit to produce a first stage output, wherein the first stage of the circuit includes a first plurality of modules coupled together to produce the first stage output. Operation 1506 includes applying the first stage output as an input signal to a second stage of the circuit to produce a differential bipolar second stage output, wherein the second stage of the circuit includes a second plurality of floating modules coupled together to produce the differential bipolar second stage output. The method ends in operation 1508.

Figure 16:
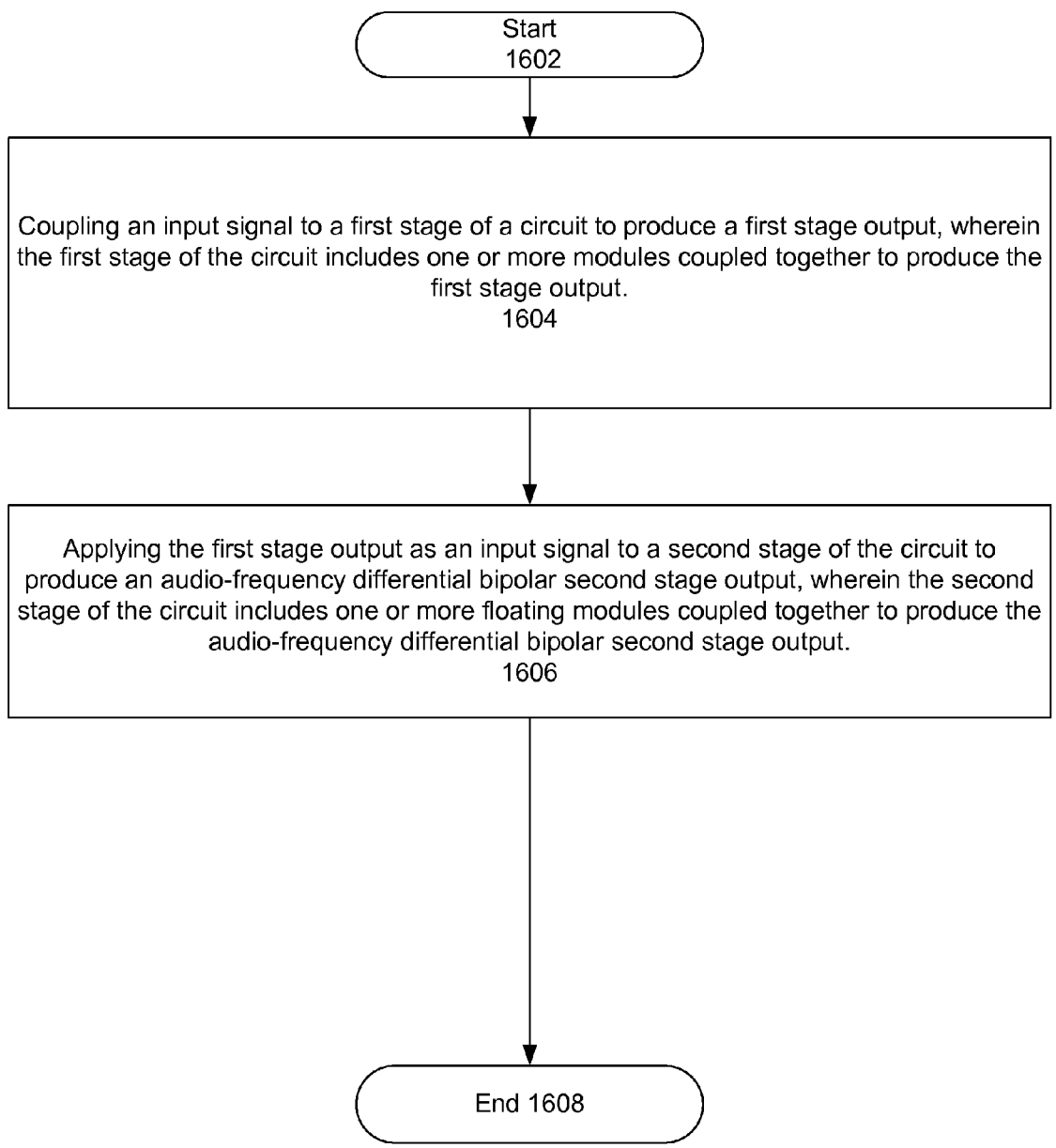
FIG. 16 illustrates a flowchart of a method to produce an audio-frequency differential bipolar output signal from a circuit having at least two stages, according to one embodiment of the invention.

FIG. 16 illustrates a flowchart of a method to produce an audio-frequency differential bipolar output signal from a circuit having at least two stages, according one embodiment of the invention. The sequence starts in operation 1602. Operation 1604 includes coupling an input signal to a first stage of a circuit to produce a first stage output, wherein the first stage of the circuit includes a first plurality of modules coupled together to produce the first stage output. Operation 1606 includes applying the first stage output as an input signal to a second stage of the circuit to produce an audio-frequency differential bipolar second stage output, wherein the second stage of the circuit includes a second plurality of floating modules coupled together to produce the audio-frequency differential bipolar second stage output. The method ends in operation 1608.

Figure 17:
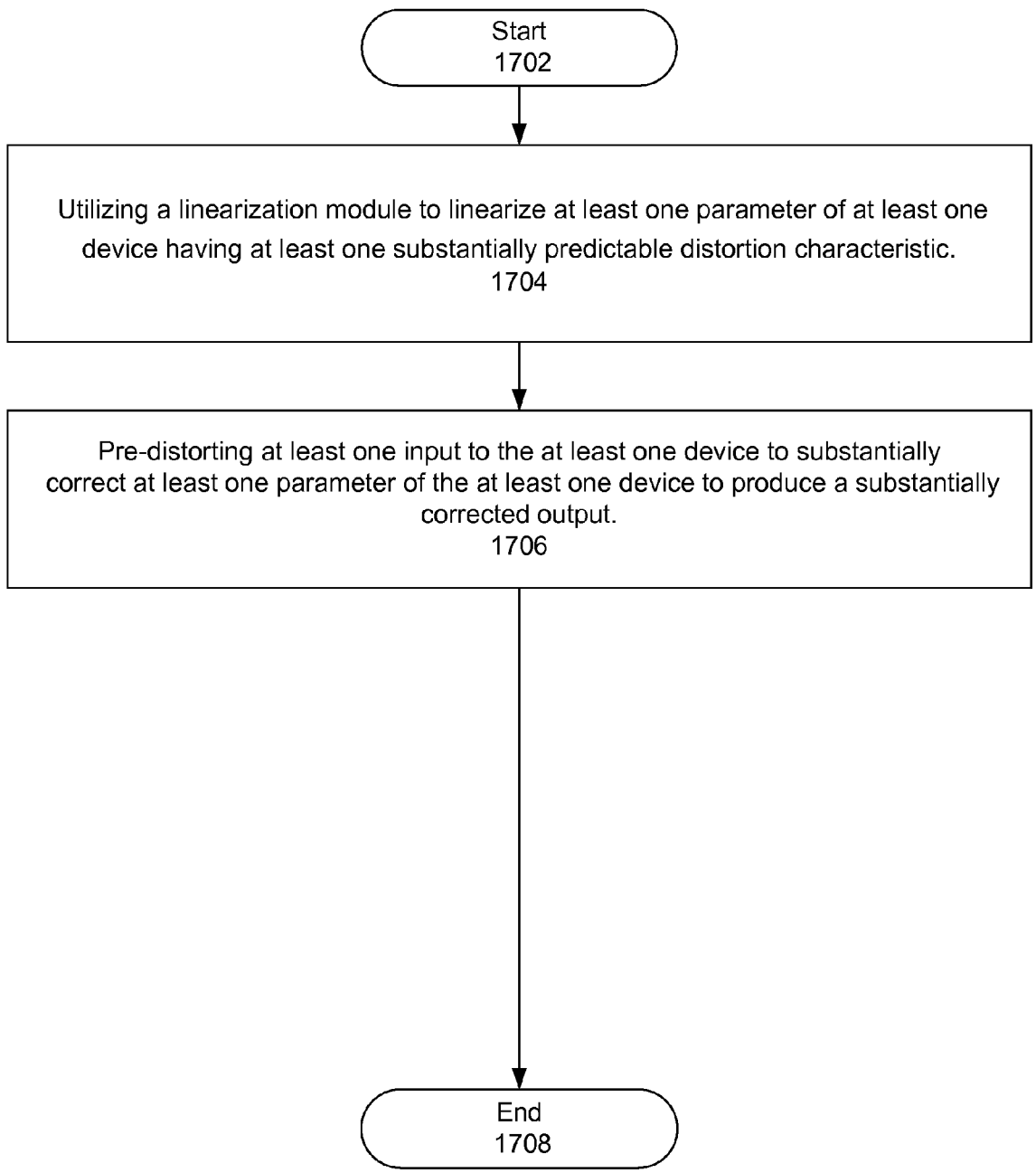
FIG. 17 illustrates a flowchart of a method to produce a substantially linear output signal from a circuit, according one embodiment of the invention.

FIG. 17 illustrates a flowchart of a method to produce a substantially linear output signal from a circuit, according one embodiment of the invention. The sequence starts in operation 1702. Operation 1704 includes utilizing a linearization module (e.g., including one or more digital lookup tables, an error simulation circuit, or an equivalent) to linearize at least one device with at least one substantially predictable distortion characteristic. Operation 1706 includes predistorting at least one input to the at least one device to substantially correct at least one parameter of the at least one device to produce a substantially corrected output. The method ends in operation 1708.

If the values are simply inserted in the active lookup table, there will be glitches in the output signal. If two lookup tables are used with a simple gradual "pan" between the two outputs of the two tables, then there will be no discontinuities on the output when the switch occurs. Panning is achieved by the gradual shifting of complimentary amplitude scaling of the two outputs and final summing. This panning has to occur slowly enough so that it does not introduce an audible thump. When a lookup table is updated it will be for a small number of values of the table. If only a single value is changed, then a glitch in the output will occur when the signal references this point. By smoothing (e.g, using a quadratic or spline function), the table and all its neighboring values can be updated while maintaining a continuous function in the table. The nature of this smoothing can be varied for different parts of the table.

Figure 18:
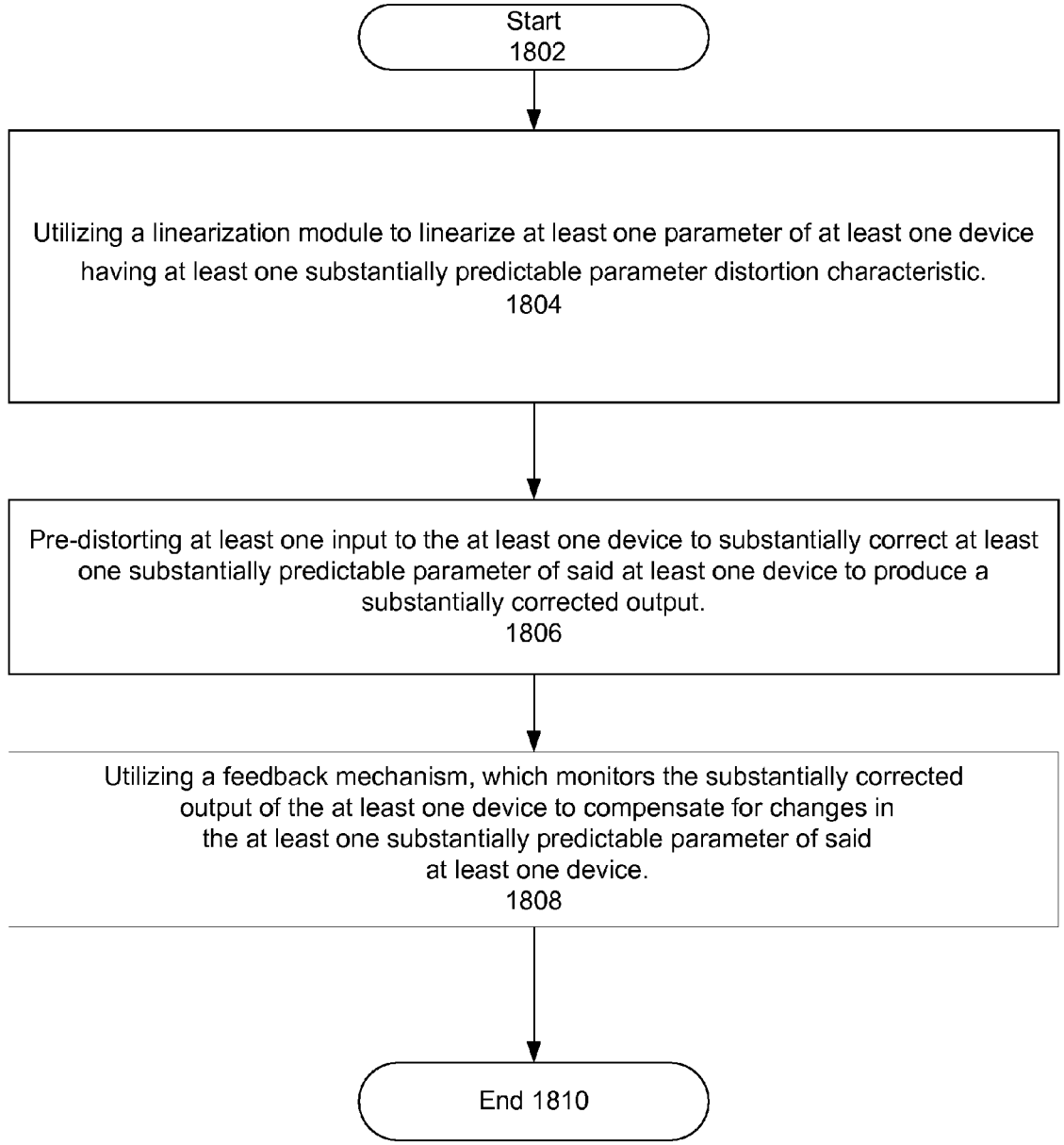
FIG. 18 illustrates a flowchart of a method to produce a substantially linear output signal from a circuit, according one embodiment of the invention.

FIG. 18 illustrates a flowchart of a method to produce a substantially linear output signal from a circuit, according one embodiment of the invention. The sequence starts in operation 1802. Operation 1804 includes utilizing a linearization module (e.g., including a digital lookup table, an error simulation circuit, or an equivalent) to linearize at least one parameter of at least one device in said circuit, wherein said at least one device has at least one substantially predictable parameter distortion characteristic. Operation 1806 includes pre-distorting at least one input signal to said at least one device to effectively correct said at least one substantially predictable parameter of said at least one device to produce a substantially corrected output. Operation 1808 includes utilizing a feedback mechanism, which monitors said substantially corrected output of said at least one device to compensate for changes in said at least one substantially predictable parameter of said at least one device (e.g., due to temperature, load, aging drift, or another equivalent factor). The method ends in operation 1810.

Figure 19:
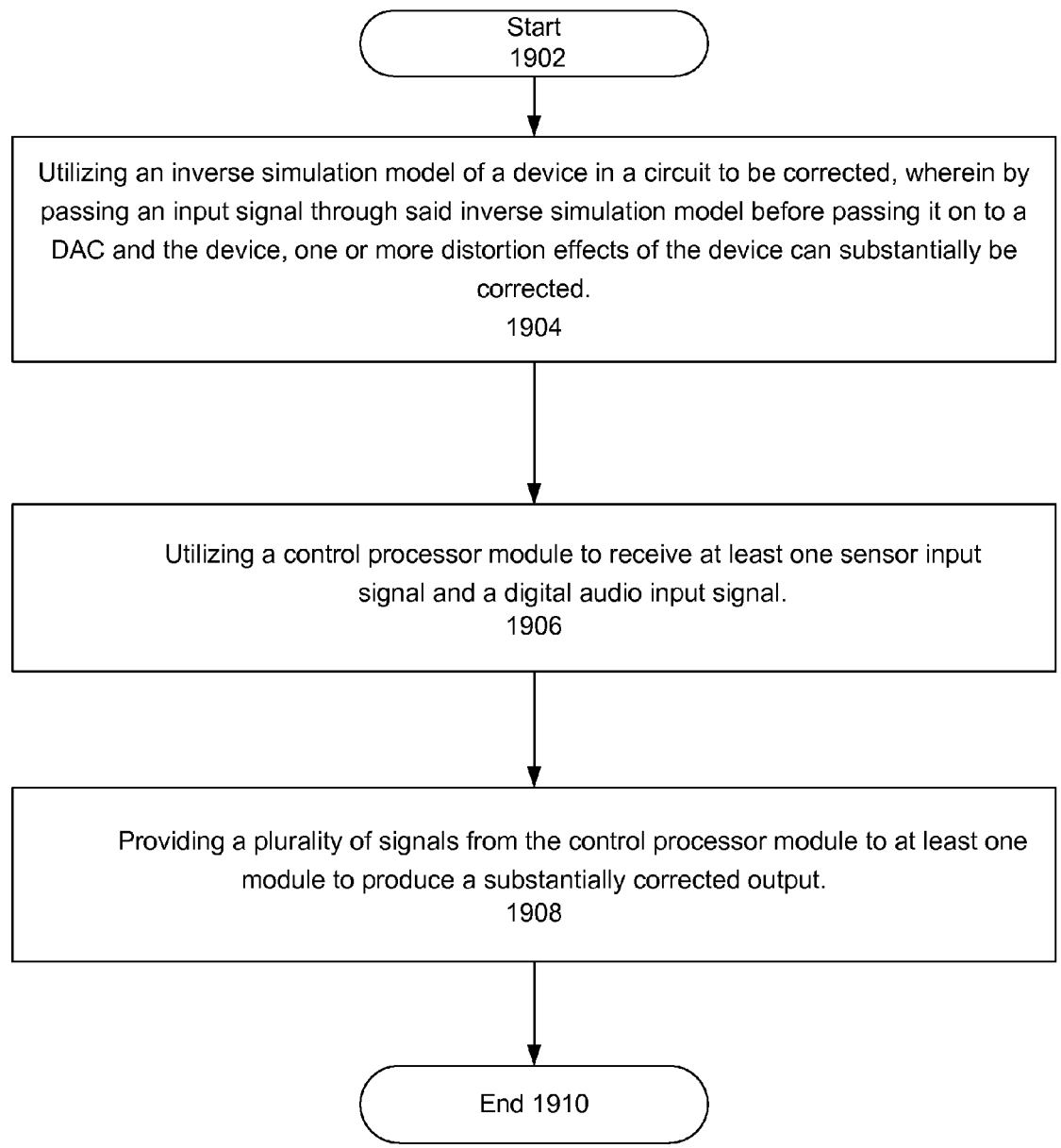
FIG. 19 illustrates a flowchart of a method to produce a substantially linear output signal from a circuit, according one embodiment of the invention.

FIG. 19 illustrates a flowchart of a method to produce a substantially linear output signal from a circuit, according one embodiment of the invention. The sequence starts in operation 1902. Operation 1904 includes utilizing an inverse simulation model of a device in a circuit to be corrected, wherein by passing an input signal through the inverse simulation model before passing it on to a DAC and the device, one or more distortion effects of the device can substantially be removed. Operation 1906 includes utilizing a control processor module to receive at least one sensor input signal and a digital audio input signal. Operation 1908 includes providing a plurality of signals from the control processor module to at least one module (e.g., such as a simulation module, an amp scale module, an offset module, a dual port lookup table module, and/or a device compensation equalization module) to produce a substantially corrected output. The method ends in operation 1910.

Figure 20:
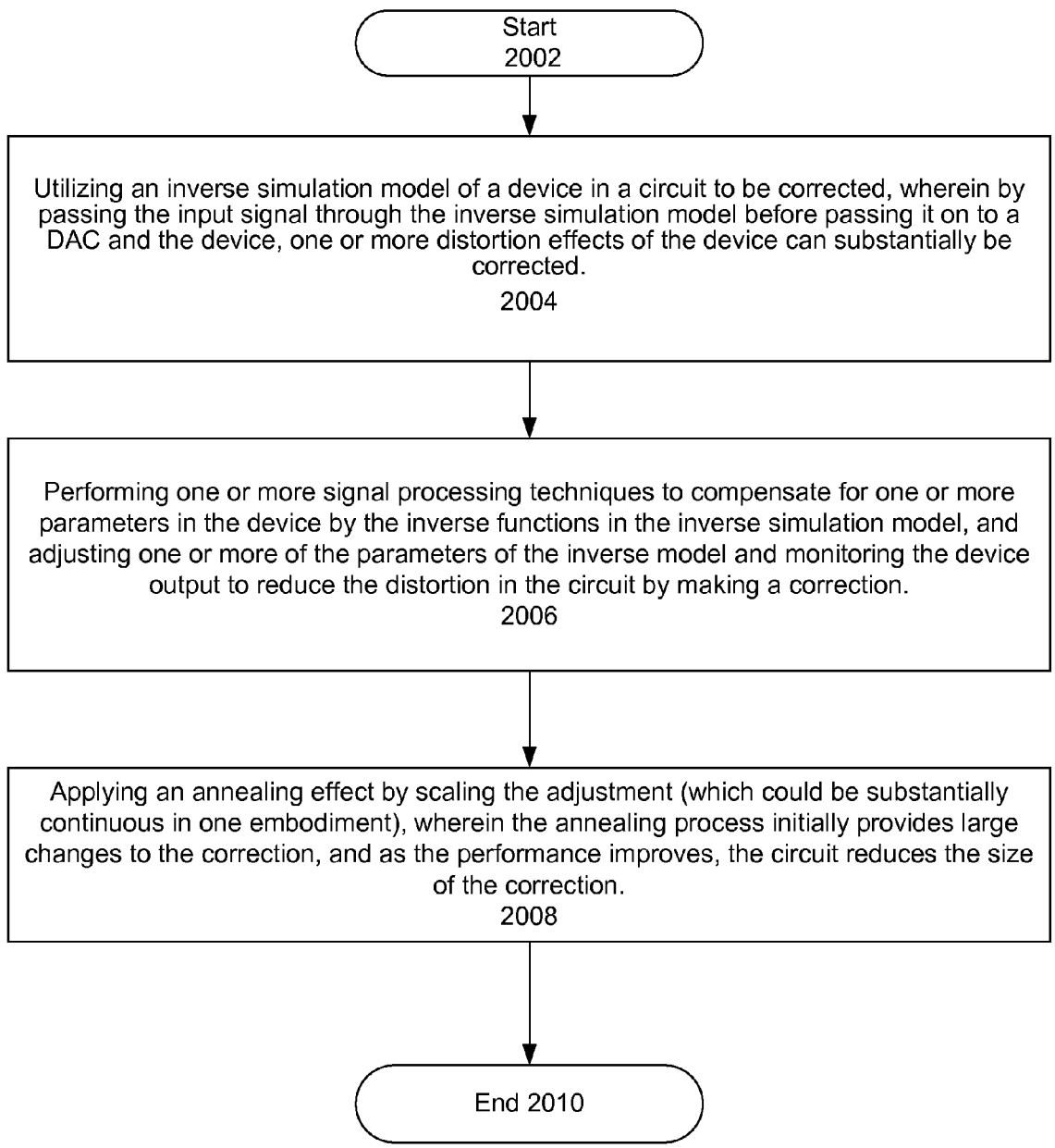
FIG. 20 illustrates a flowchart of a method to produce a substantially linear output signal from a circuit, according one embodiment of the invention.
Figure 1:
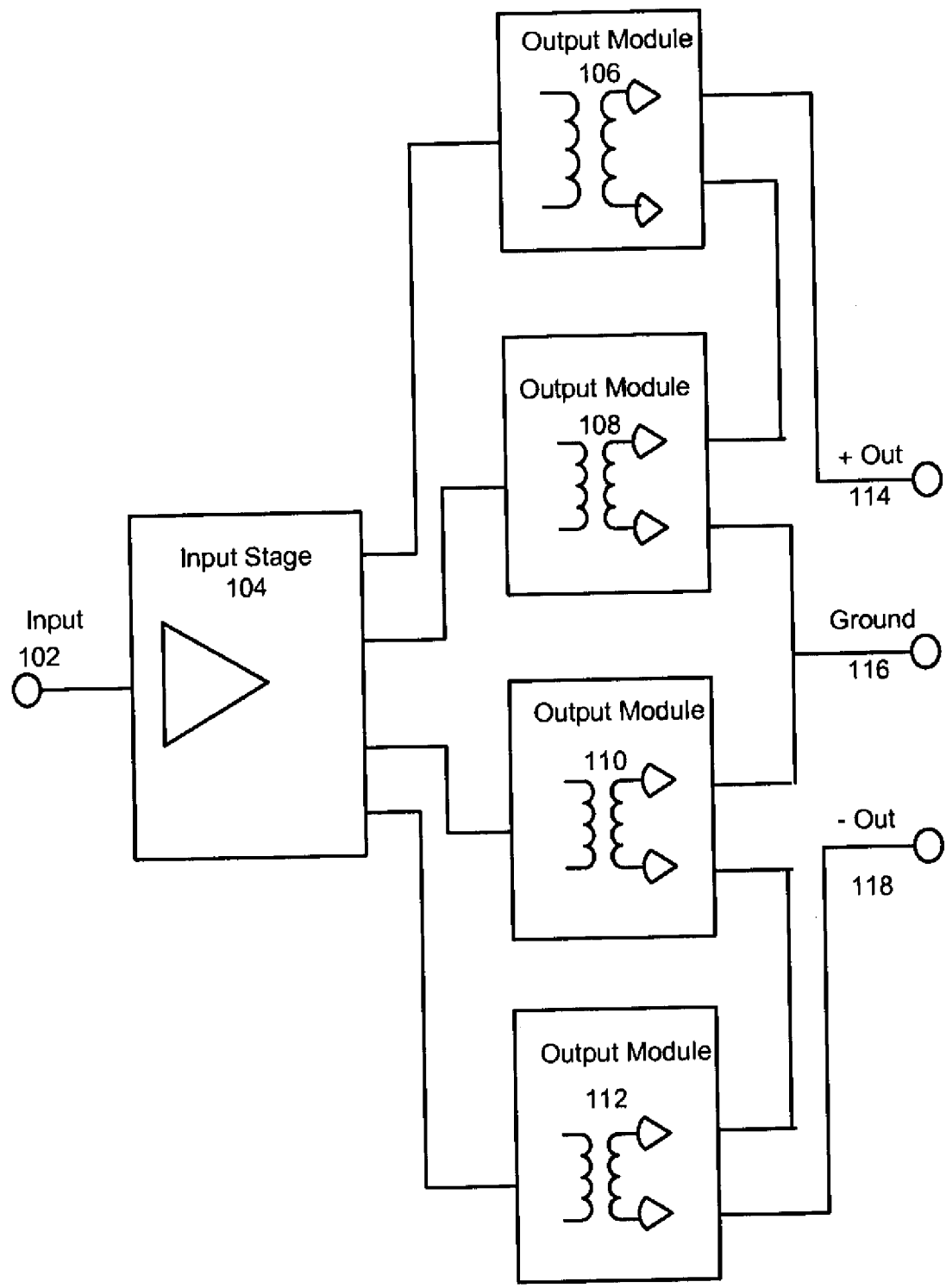
Figure 2:
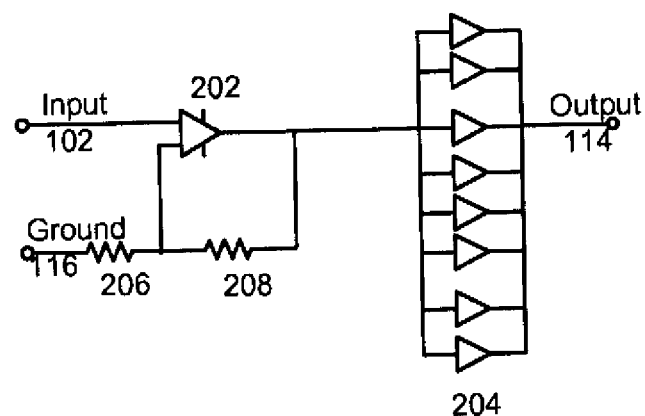
Figure 3:
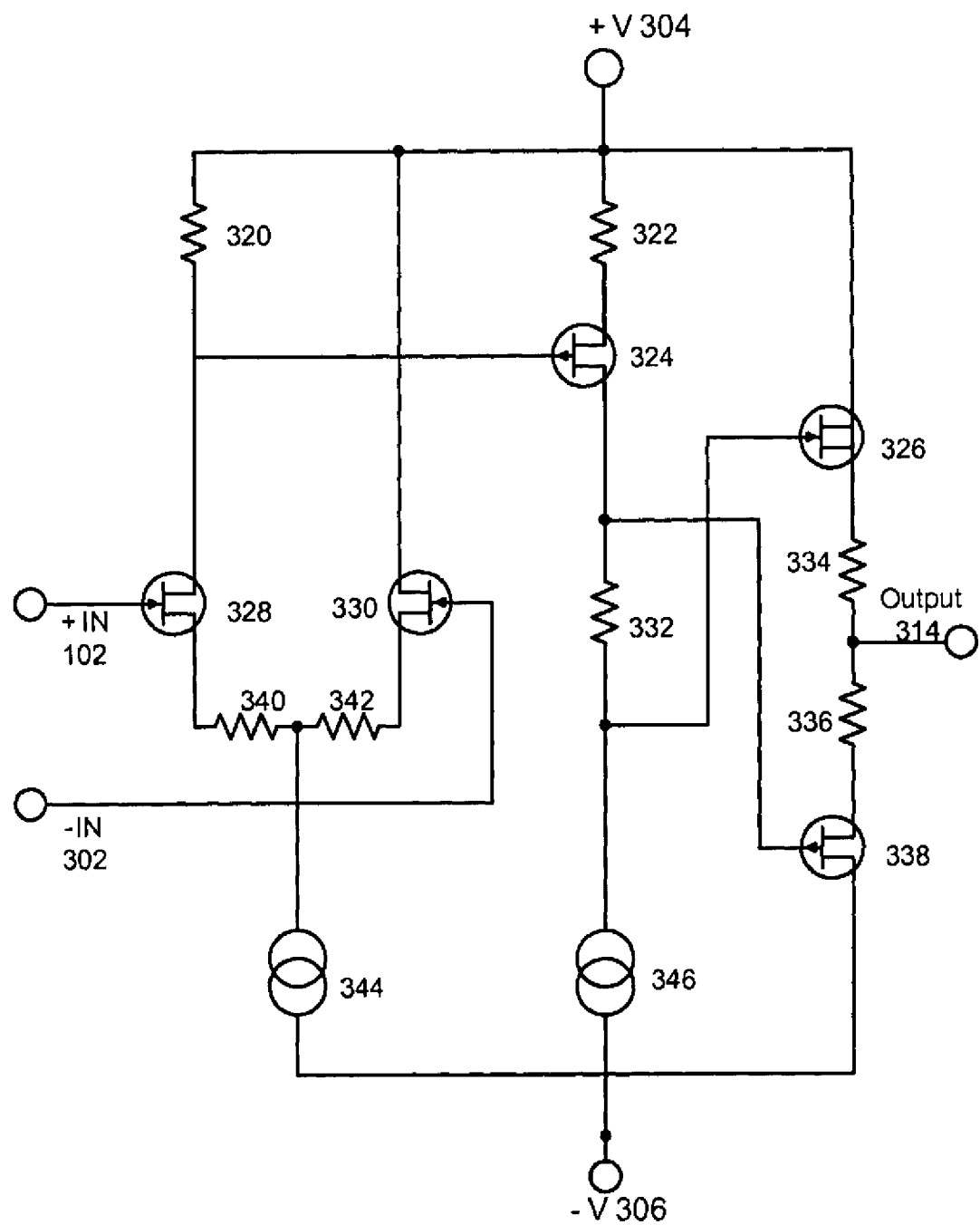
Figure 4:
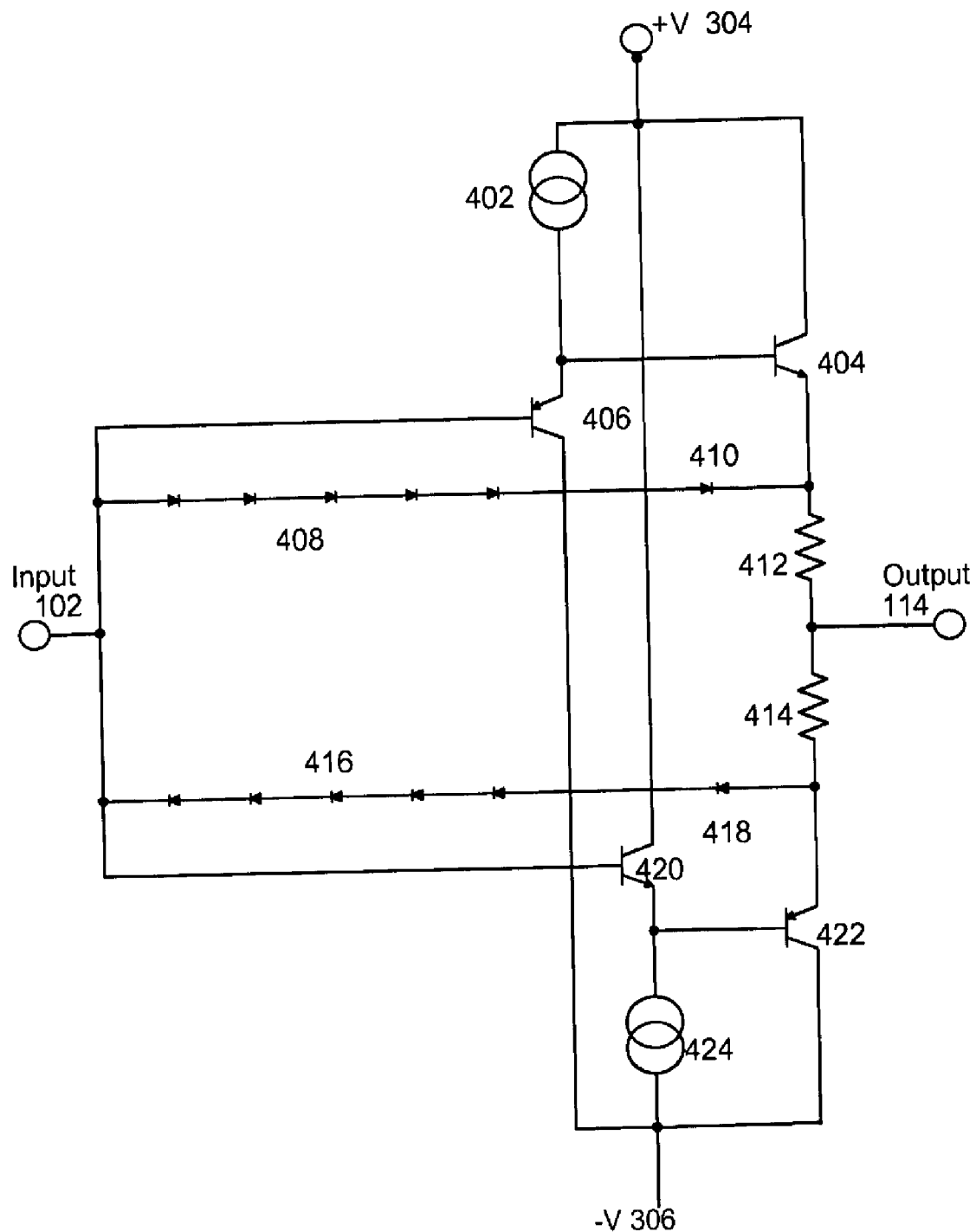
Figure 5:
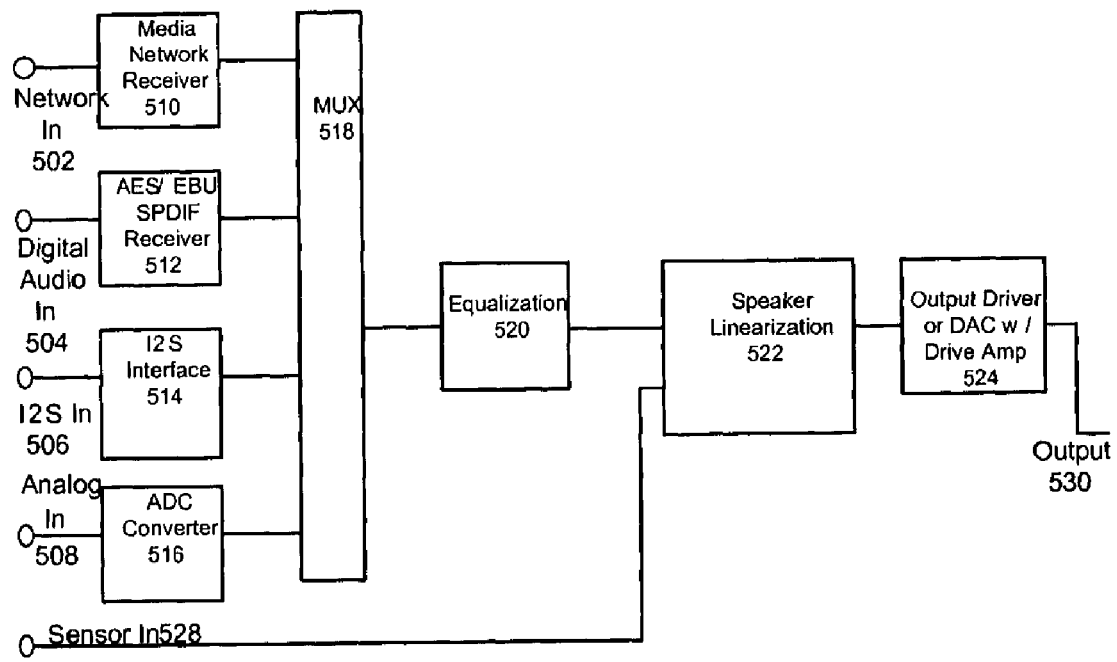
Figure 6:
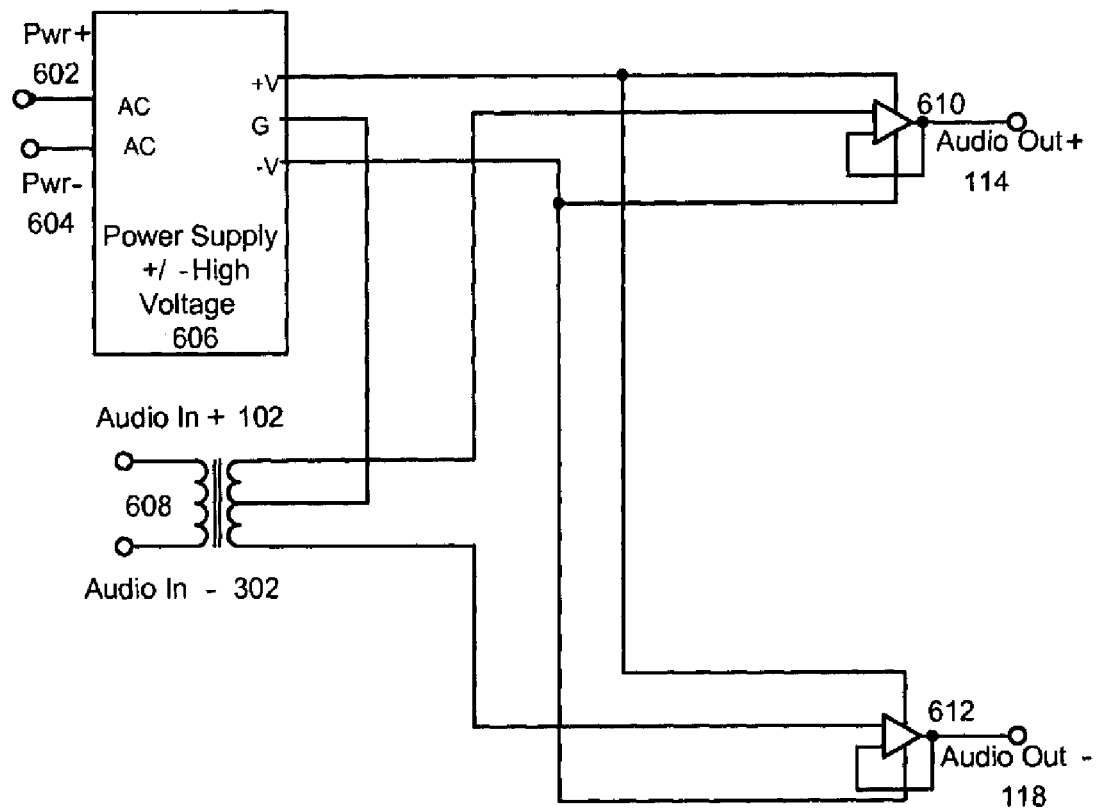
Figure 7:
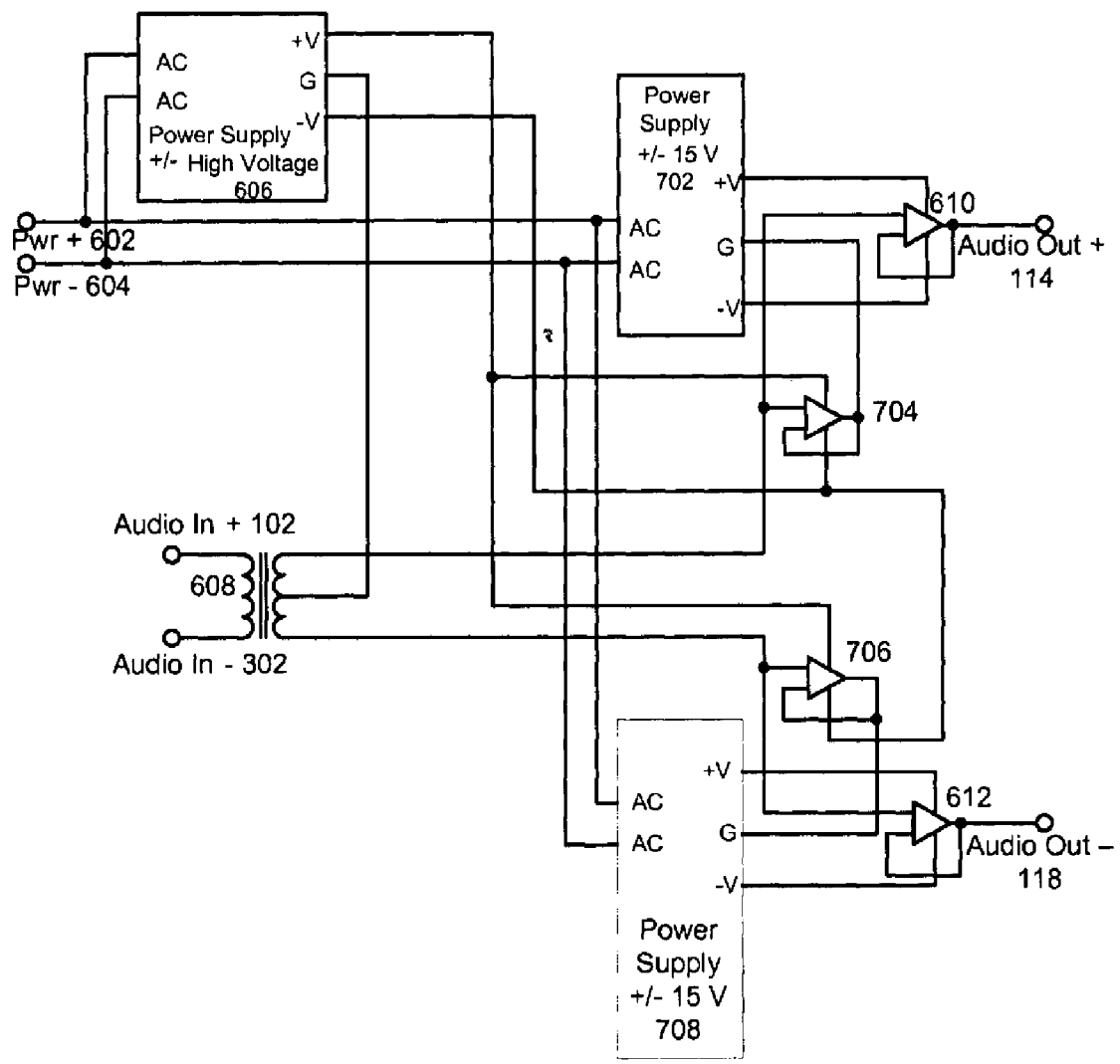
Figure 8:
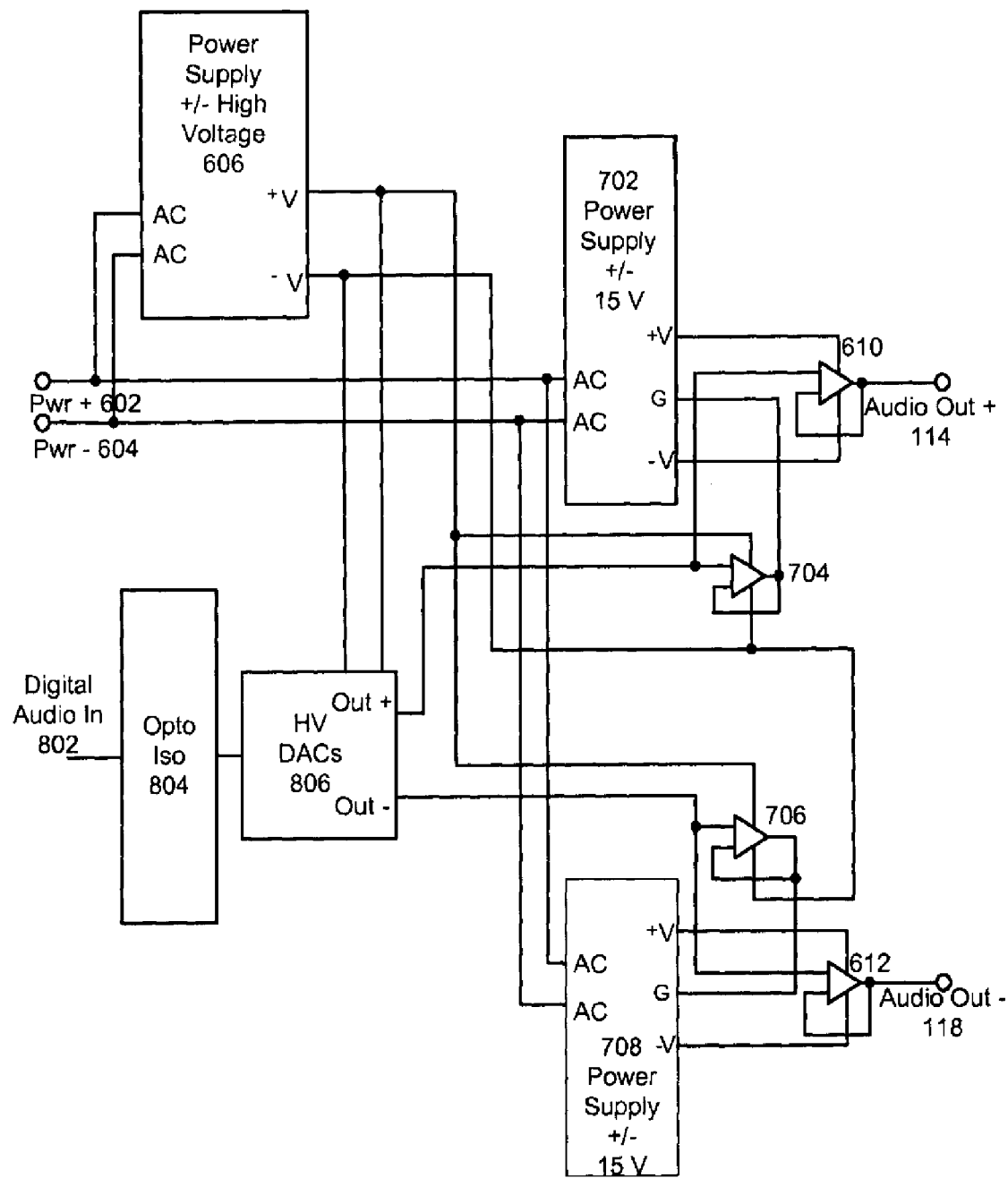
Figure 9:
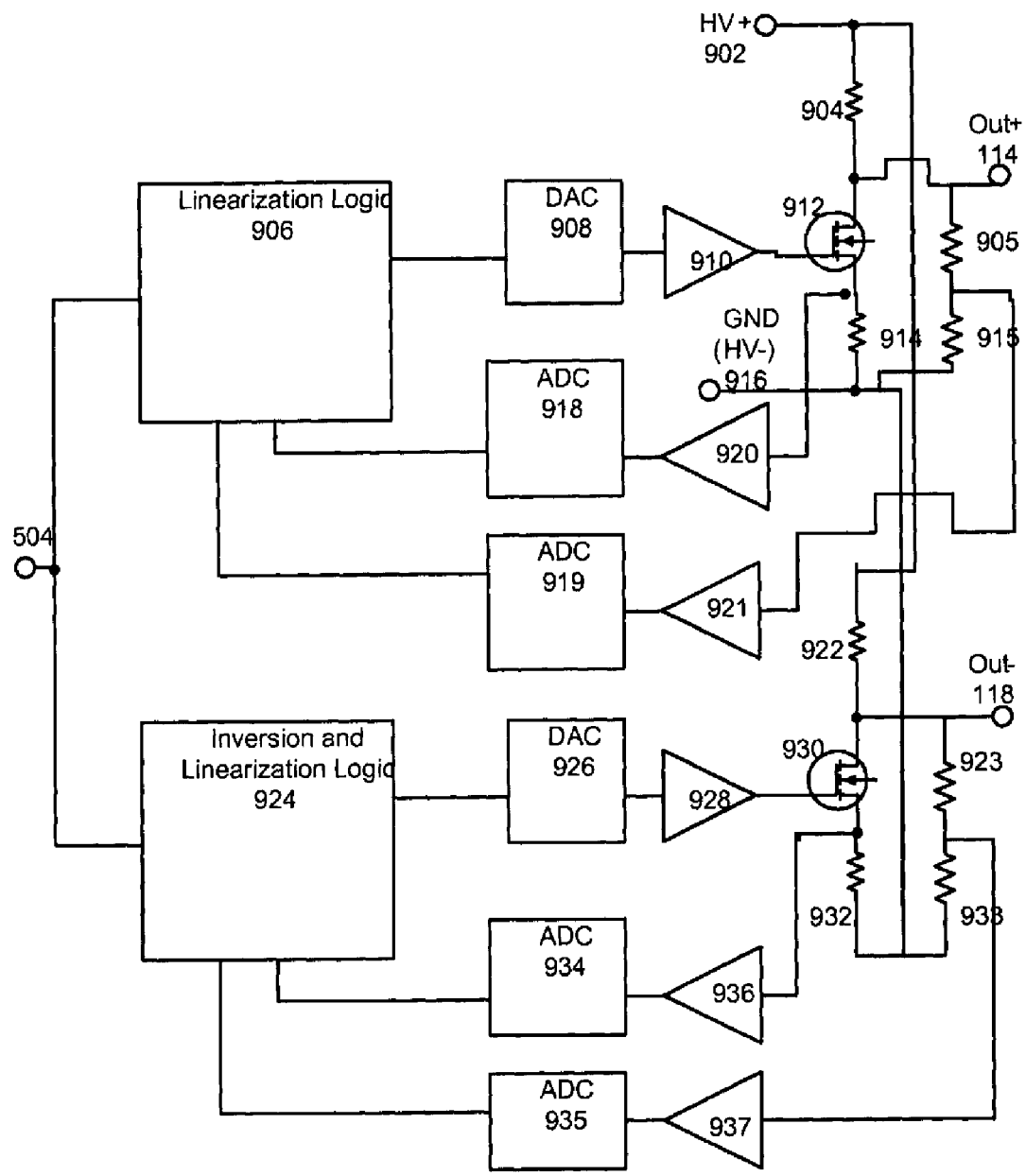
Figure 10:
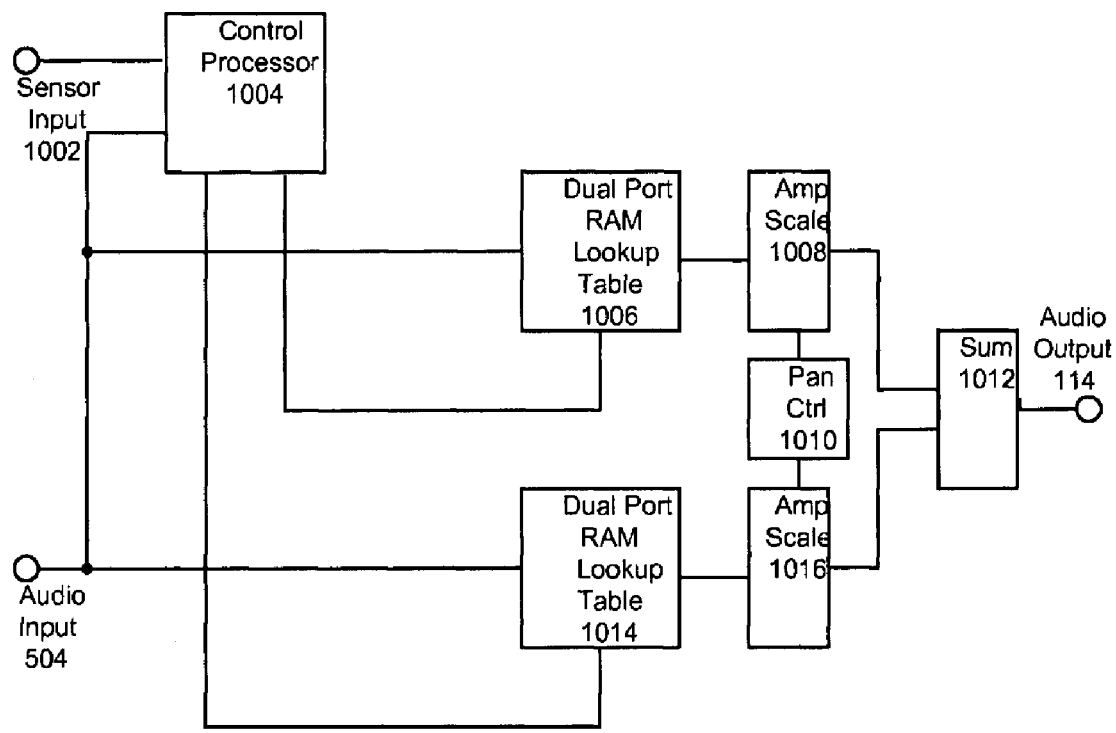
Figure 11:
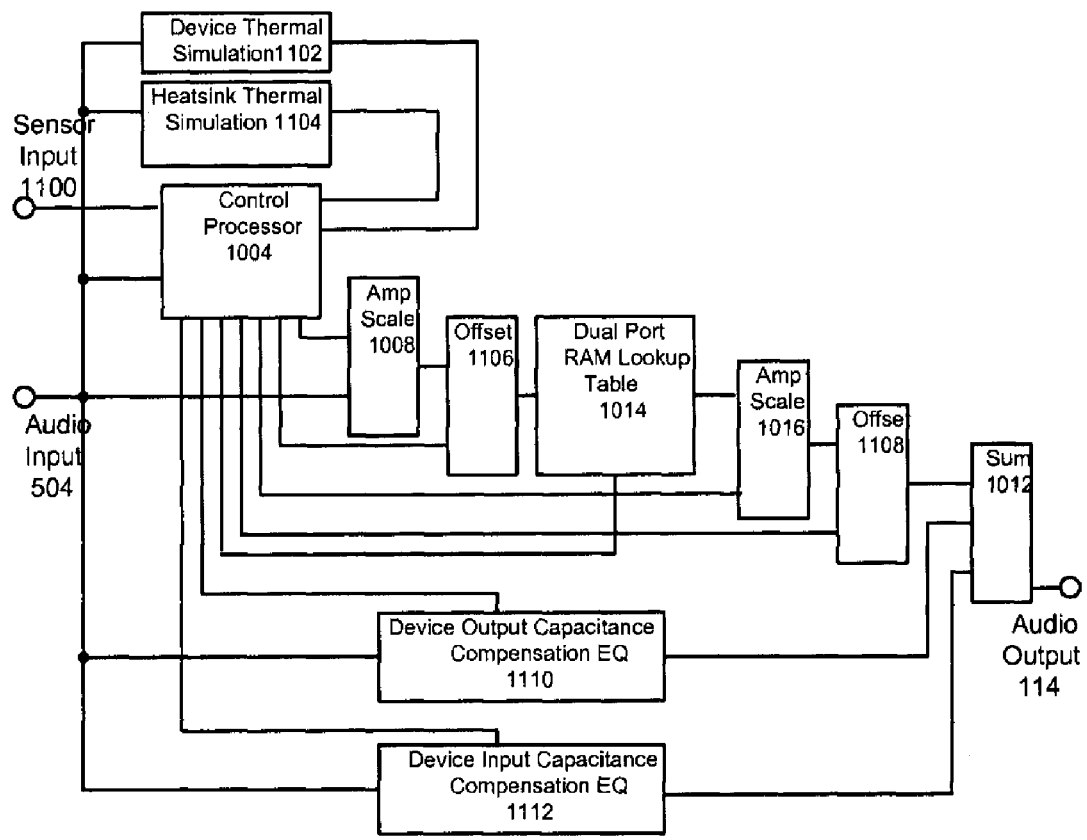
Figure 12:
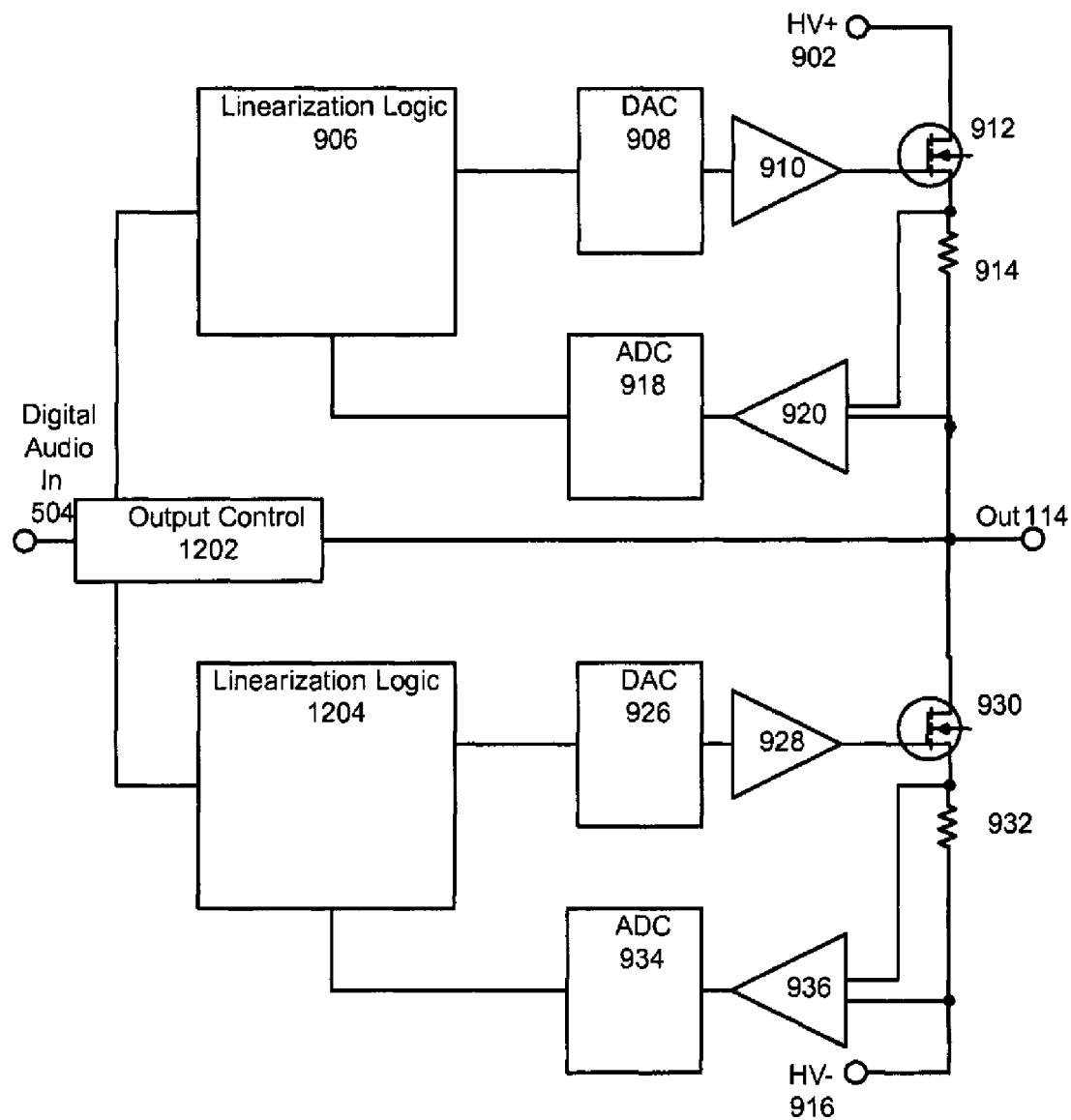
Figure 13:
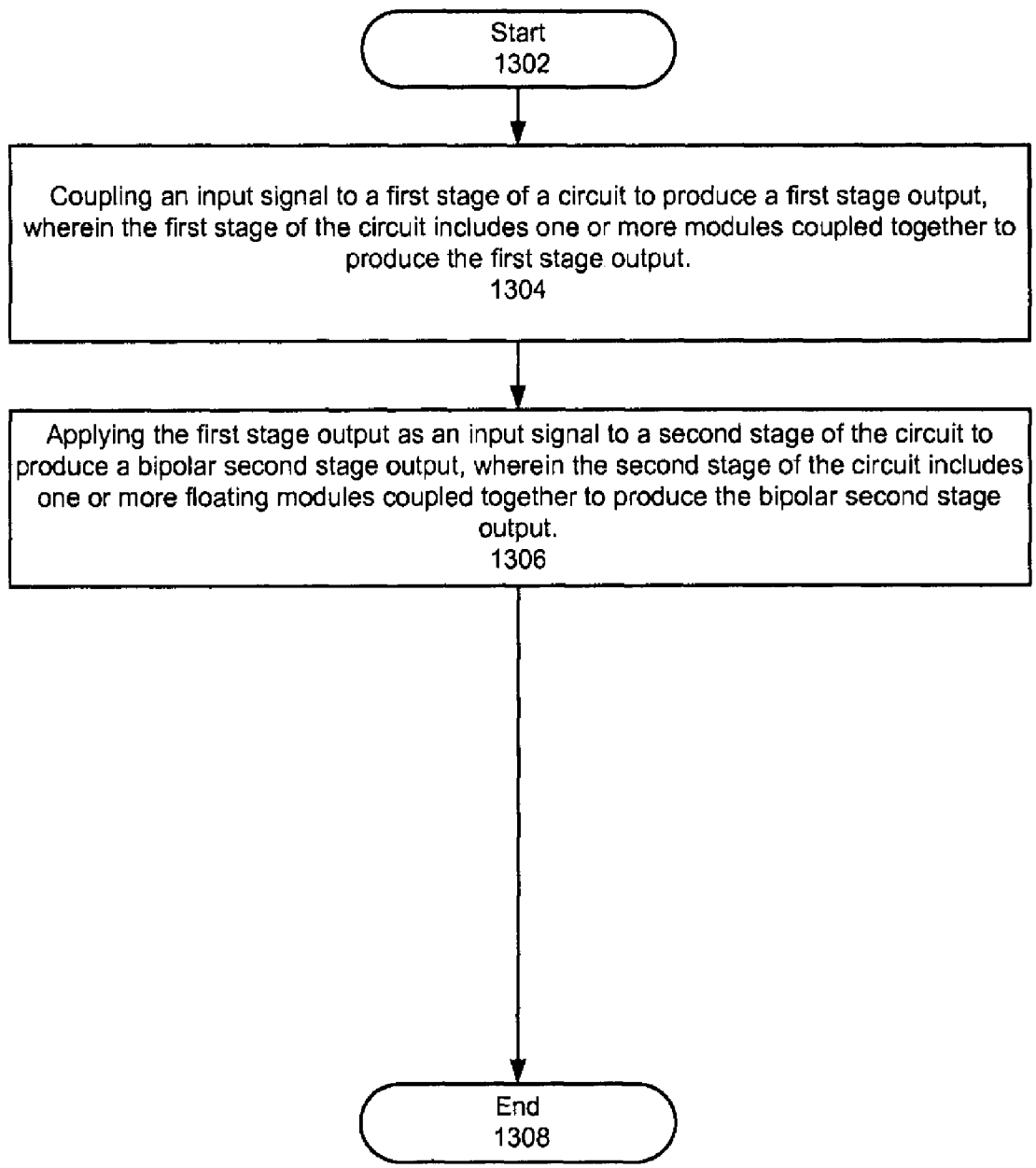
Figure 14:
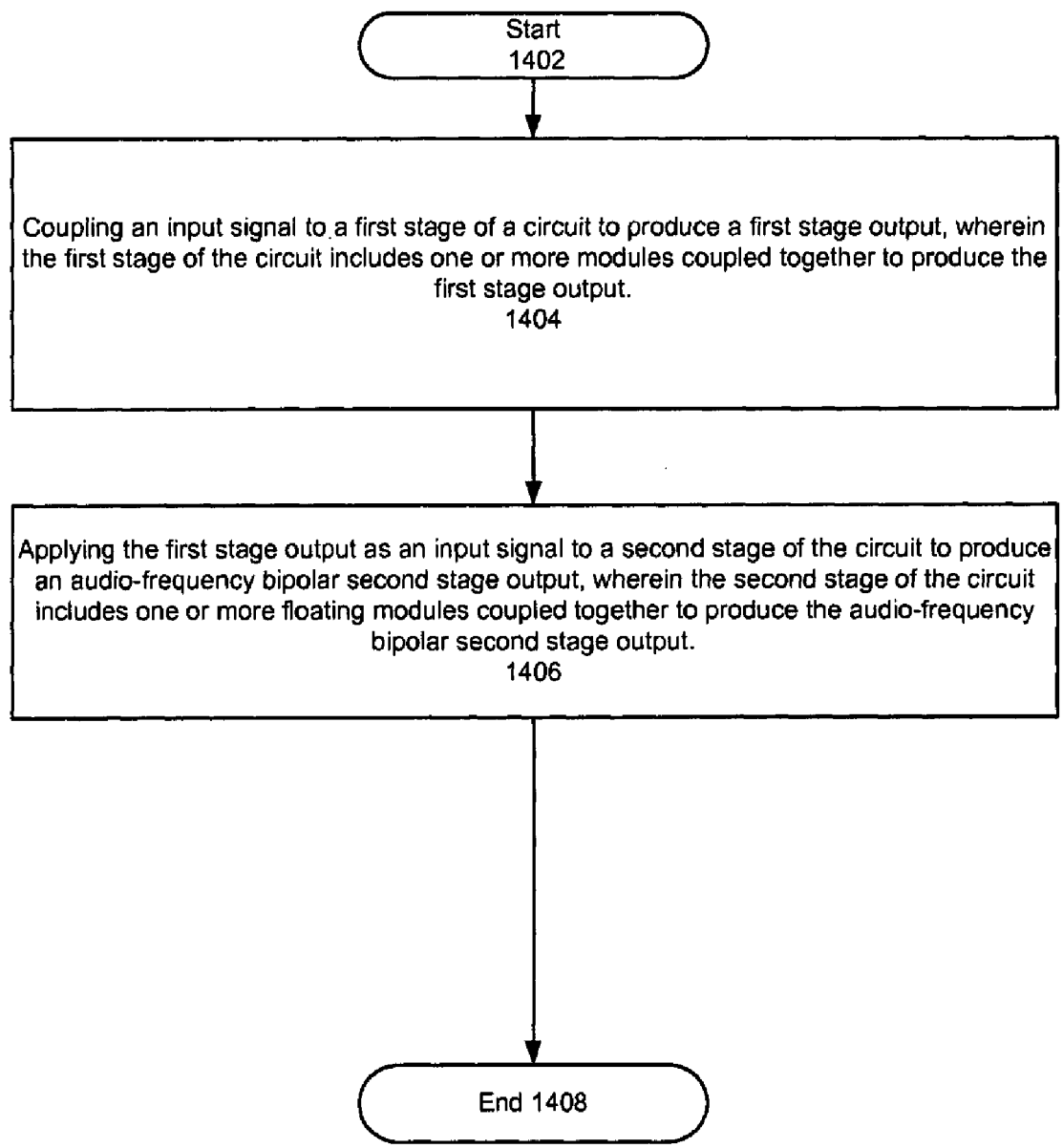
Figure 15:
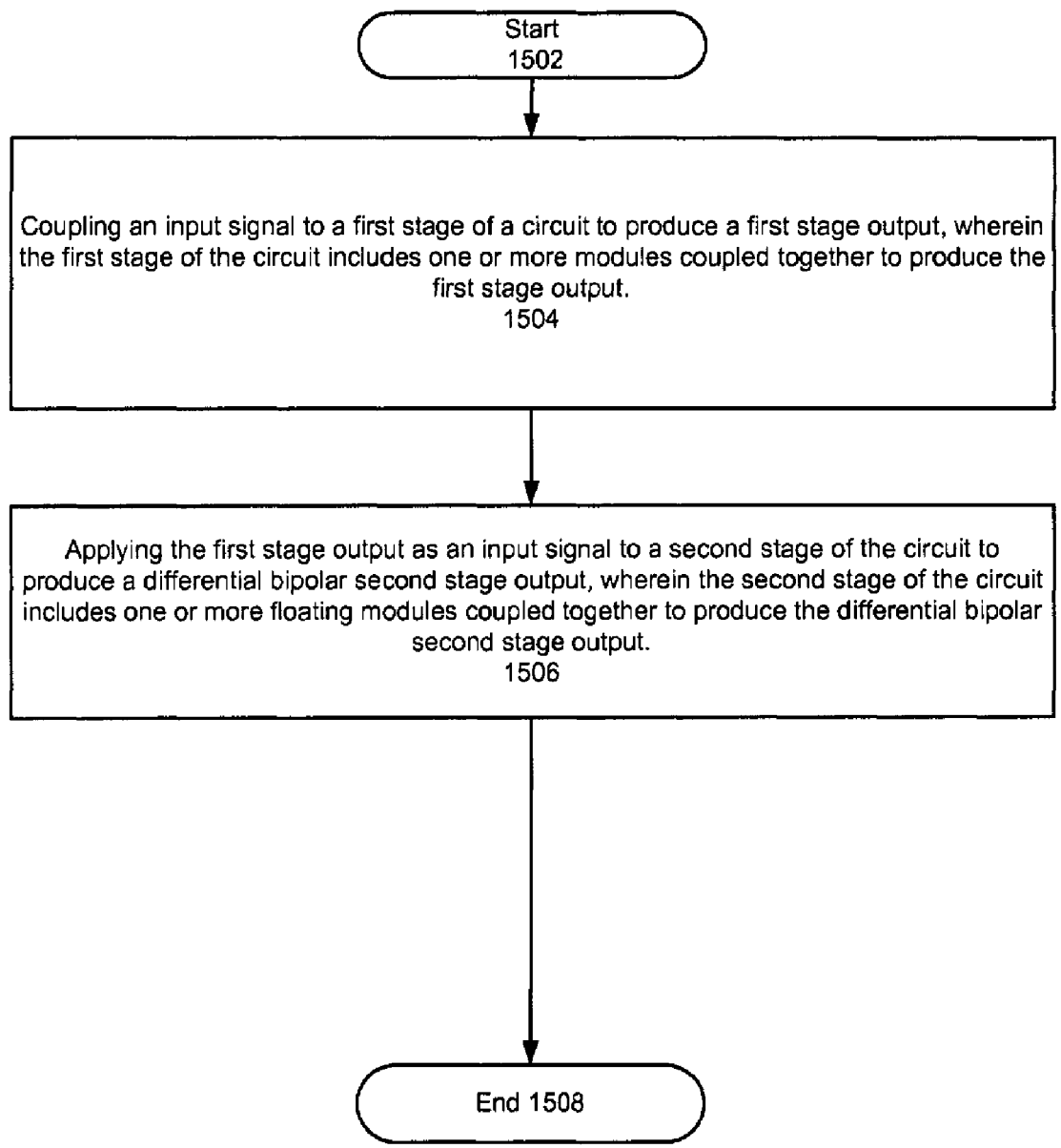
Figure 16:
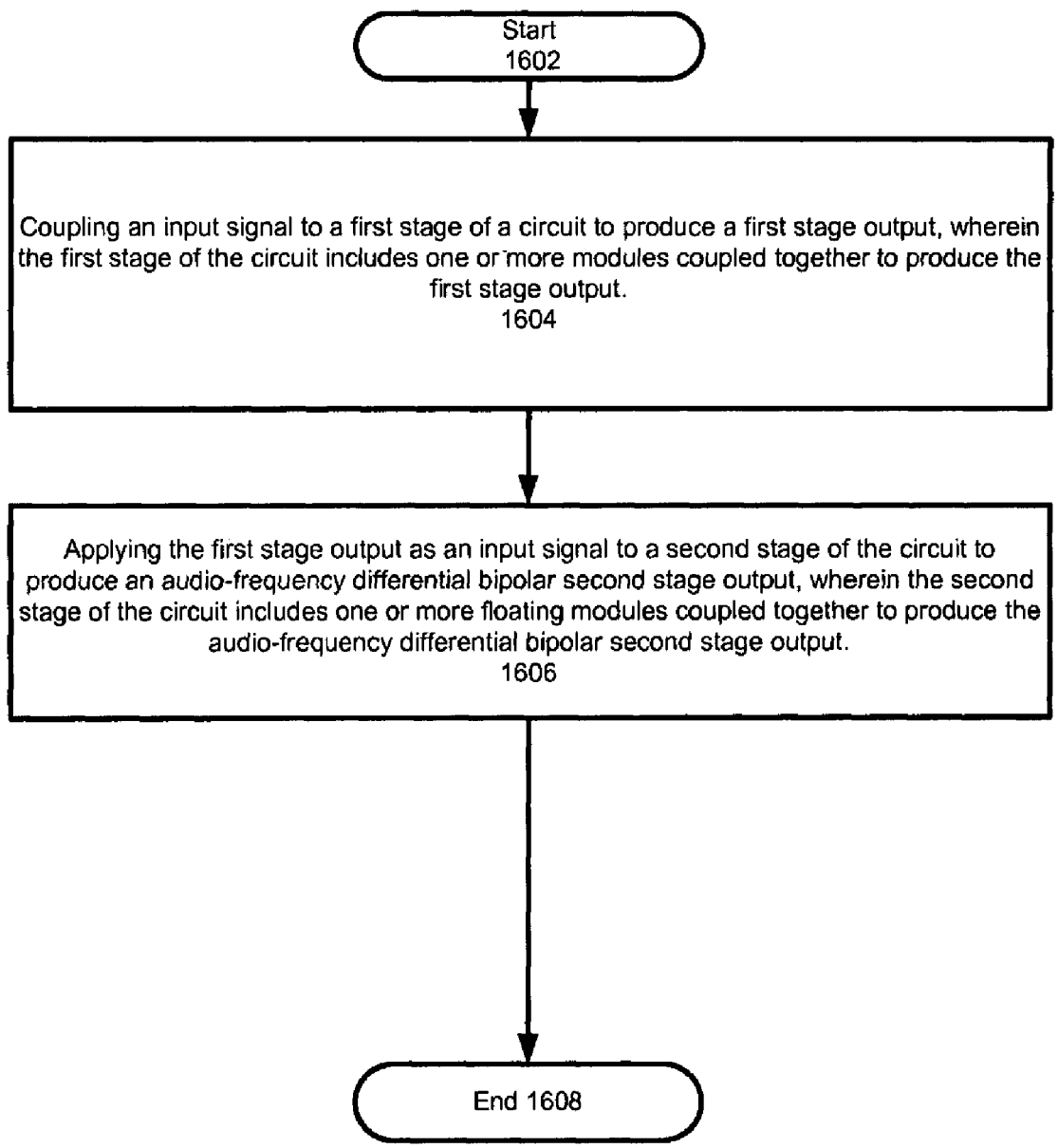
Figure 17:
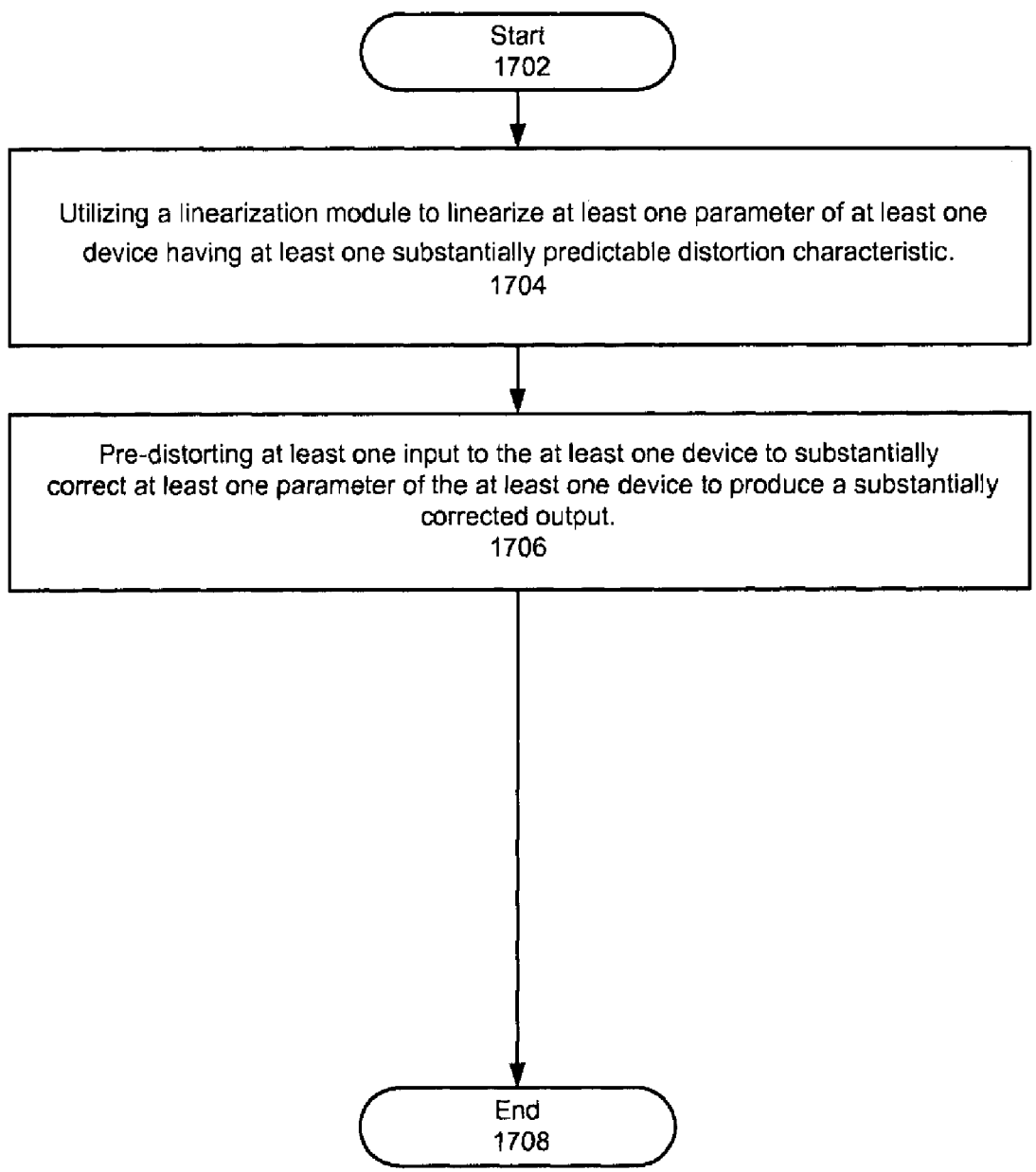
Figure 18:
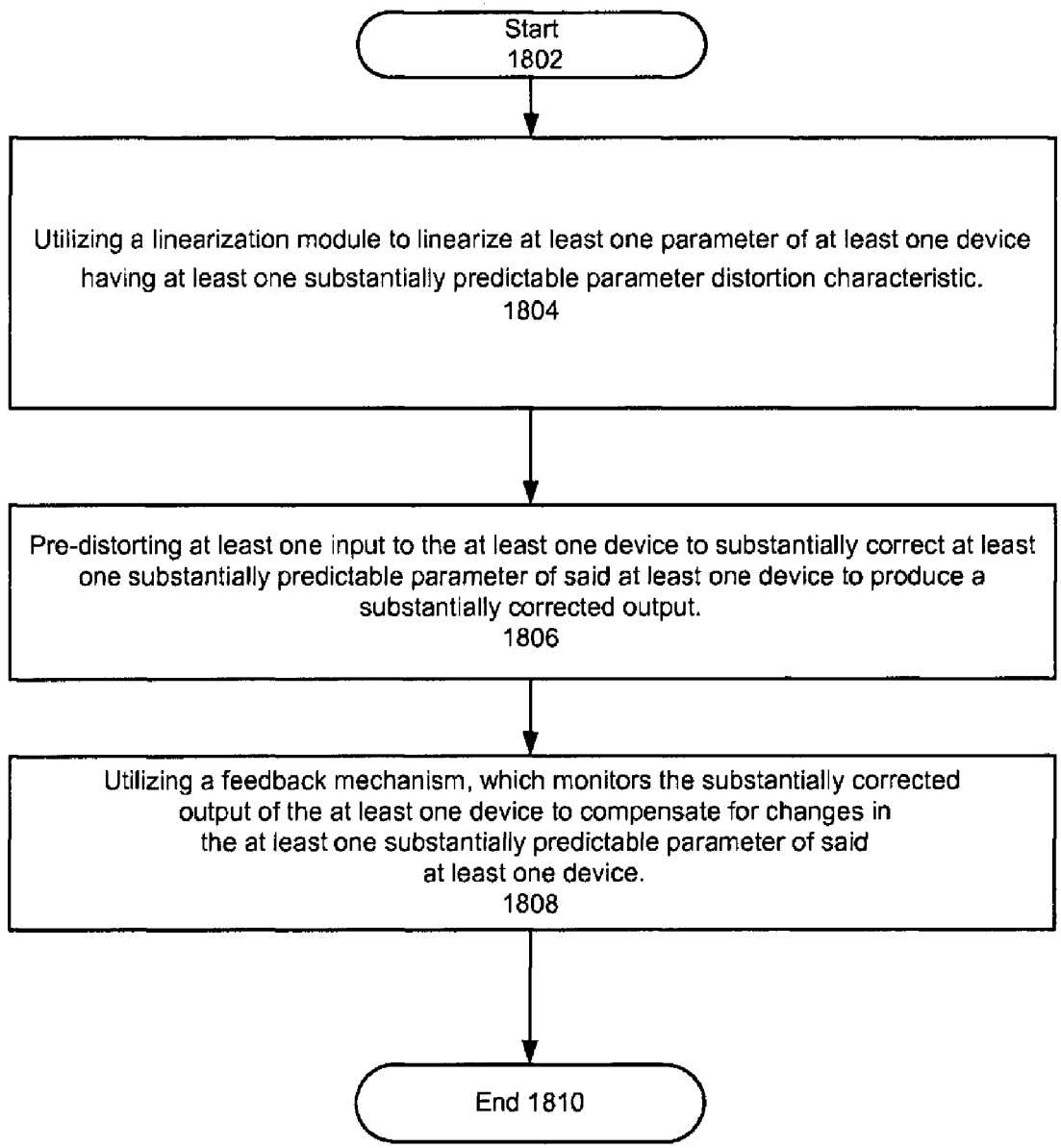
Figure 19:
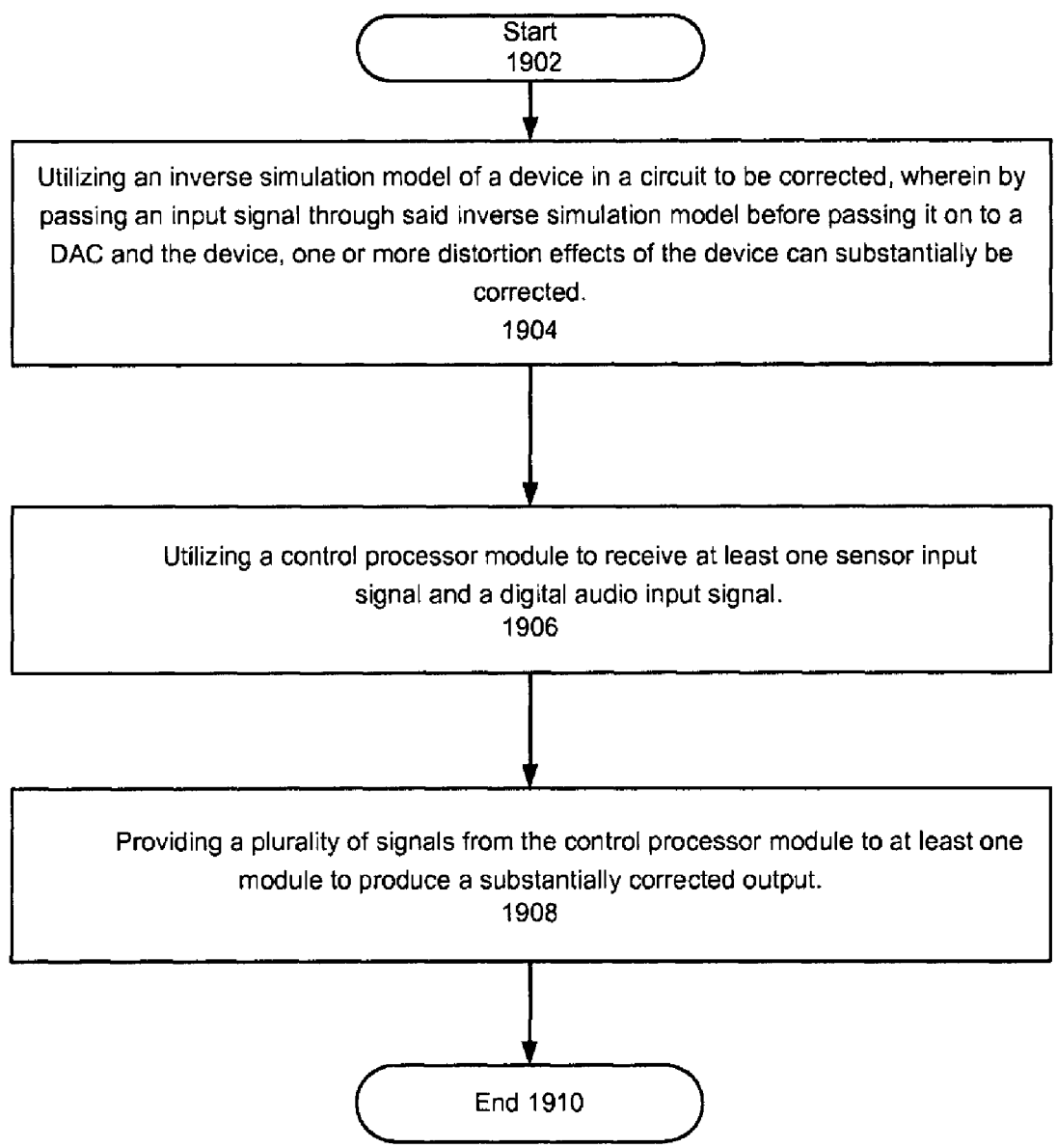
Figure 20:
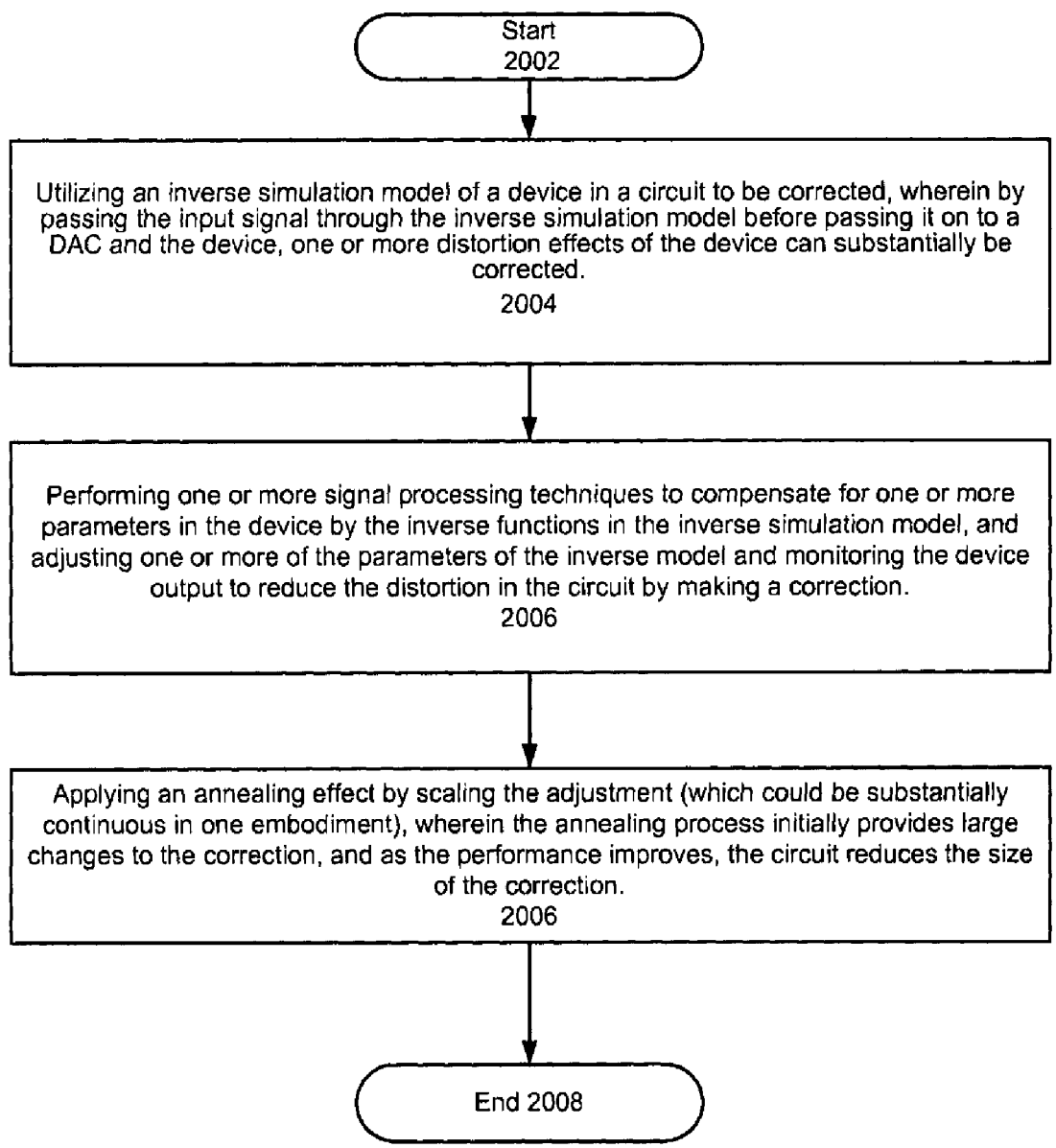

FIG. 20 illustrates a flowchart of a method to produce a substantially linear output signal from a circuit, according one embodiment of the invention. The sequence starts in operation 2002. Operation 2004 includes utilizing an inverse simulation model of a device in a circuit to be corrected, wherein by passing the input signal through the inverse simulation model before passing it on to a DAC and the device, one or more distortion effects of the device can substantially be corrected. Operation 2006 includes performing one or more signal processing techniques to compensate for one or more distorting parameters (e.g., distortion effects, capacitances, inductances, resistances, or another equivalent parameter) in the device by the inverse functions in the inverse simulation model, and adjusting one or more of the parameters of the inverse model and monitoring the actual device output to reduce distortion in the circuit by making a correction. Operation 2008 includes applying an annealing effect by scaling the adjustment (which could be substantially continuous in one embodiment), wherein the annealing process initially provides large changes ("high heat") to the correction, and as the performance improves, the circuit reduces the size of the correction ("lower heat"). The method ends in operation 2010.

In summary, one embodiment of the invention uses differential amplifiers. And the amplifier outputs can go both positive and negative with respect to each other. With conventional designs using transistors or FETs, the collector/anode has to stay more positive than the emitter/drain for the amplifier to function. In one embodiment of the invention, since each output can go positive and negative, it is possible to provide a real differential bipolar output, rather than a single unipolar one. An alternative embodiment uses a unipolar output, but it would require a series capacitor that would limit the output signal fidelity. In another embodiment of the invention, one or more circuit stages are not amplifiers and are instead unity-gain buffers or an equivalent. The use of unity-gain buffers improves the performance of the circuit, since the linearity is very high. Another embodiment of invention uses one or more stages with amplifiers having a gain greater than unity, either in voltage or in current.

Several embodiments of the invention are possible. The phrase "in one embodiment" used in the specification can refer to a new embodiment, a different embodiment disclosed elsewhere in the application, or the same embodiment disclosed earlier in the application. The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to produce a substantially linear output signal from a circuit, said method comprising:

utilizing a linearization module to linearize at least one parameter of at least one device in said circuit, wherein said at least one device has at least one substantially predictable parameter distortion characteristic;

pre-distorting an input signal to said at least one device to substantially correct said at least one substantially predictable parameter of said at least one device to produce a substantially corrected output; and utilizing a feedback mechanism, which monitors said substantially corrected output of said at least one device to compensate for changes in said at least one substantially predictable parameter of said at least one device to produce a substantially linear output signal.

2. The method of claim 1, wherein said at least one substantially predictable parameter includes a parameter selected from the group of parameters consisting of capacitances, inductances, resistances, parameters varying by a temperature of said at least one device, parameters varying by a current source or sink on said at least one device, parameters varying by a voltage differential on said at least one device, and parameters drifting by an aging of said at least one device.

3. The method of claim 1, further comprising:

using a plurality of lookup table entries for said pre-distorting at least one input; and panning of said plurality of lookup table entries to substantially eliminate a second plurality of single value correction adjustment glitches to produce a substantially linear output signal.

4. The method of claim 1, wherein said substantially linear output signal includes at least one audio-frequency signal.

5. The method of claim 1, wherein said substantially linear output signal is provided by at least one differential amplifier.

6. The method of claim 1, wherein said substantially linear output signal is provided by at least one bipolar amplifier.

7. A method to produce a substantially linear output signal from a circuit, said method comprising:

utilizing an inverse simulation model of at least one device in a circuit to be corrected, wherein by passing an input signal through said inverse simulation model before providing said input signal as an input to a DAC and said at least one device, one or more distortion effects of said at least one device can substantially be corrected;

utilizing a control processor module to receive at least one sensor input signal and a digital audio input signal; and providing a plurality of signals from said control processor module to at least one output module to produce a substantially corrected output signal.

8. The method of claim 7, wherein said one or more distortion effects are caused by a parameter selected from the group of parameters consisting of capacitances, inductances, resistances, parameters varying by a temperature of said at least one device, parameters varying by a current source or sink on said at least one device, parameters varying by a voltage differential on said at least one device, and parameters drifting by an aging of said at least one device.

9. The method of claim 7, further comprising:

using a plurality of lookup table entries for said inverse simulation model for pre-distorting at least one input; and panning of said plurality of lookup table entries to substantially eliminate a second plurality of single value correction adjustment glitches to produce a substantially linear output signal.

10. The method of claim 9, wherein said substantially linear output signal is provided by at least one differential amplifier.

11. The method of claim 9, wherein said substantially linear output signal is provided by at least one bipolar amplifier.

12. The method of claim 7, further comprising outputting a substantially linear output signal that includes at least one audio-frequency signal.

13. The method of claim 7, wherein said at least one device having one or more distortion effects includes at least one transducer for a loudspeaker.

14. A method to produce a substantially linear output signal from a circuit, said method comprising:

utilizing an inverse simulation model of at least one device in a circuit to be corrected, wherein by passing said input signal through said inverse simulation model before providing said input signal as an input to a DAC and said at least one device, one or more distortion effects of said at least one device can substantially be corrected;

performing one or more signal processing techniques to compensate for one or more distorting parameters in said at least one device by one or more inverse functions in said inverse simulation model, and adjusting one or more parameters of said inverse model and monitoring said at least one device output to reduce distortion in said circuit by making a correction; and applying an annealing process by scaling said adjustment, wherein said annealing process initially provides larger correction, and as performance of said circuit improves, said circuit reduces said correction to produce a substantially linear output signal.

15. The method of claim 14, further comprising:

using a plurality of lookup table entries for said inverse simulation model to compensate for one or more distorting parameters by making said correction; and panning of said plurality of lookup table entries to substantially eliminate a second plurality of single value correction adjustment glitches to produce a substantially linear output signal.

16. The method of claim 15, wherein said substantially linear output signal is provided by at least one differential amplifier.

17. The method of claim 15, wherein said substantially linear output signal is provided by at least one bipolar amplifier.

18. The method of claim 15, wherein said at least one device having one or more distortion effects includes at least one transducer for a loudspeaker.

19. The method of claim 14, wherein said one or more distortion effects are caused by a parameter selected from the group of parameters consisting of capacitances, inductances, resistances, parameters varying by a temperature of said at least one device, parameters varying by a current source or sink on said at least one device, parameters varying by a voltage differential on said at least one device, and parameters drifting by an aging of said at least one device.

20. The method of claim 14, further comprising outputting a substantially linear output signal that includes at least one audio-frequency signal.

* * * * *

UNITED STATES PATENT AND TRADEMARK OFFICE
CERTIFICATE OF CORRECTION

| | | |
|---|---|---|
| PATENT NO. | : 7,449,946 B2 | Page 1 of 21 |
| APPLICATION NO. | : 12/111056 | |
| DATED | : November 11, 2008 | |
| INVENTOR(S) | : D. Robert Hoover | |

It is certified that error appears in the above-identified patent and that said Letters Patent is hereby corrected as shown below:

Delete Drawing sheets 1-20, and substitute therefor the Drawing sheets, consisting of FIGS. 1-20, as shown on the attached pages.

Signed and Sealed this

Twenty-ninth Day of December, 2009

David J. Kappos
*Director of the United States Patent and Trademark Office*